(12) United States Patent
Cheng et al.

(10) Patent No.: US 11,784,134 B2
(45) Date of Patent: Oct. 10, 2023

(54) CHIP PACKAGE AND MANUFACTURING METHOD THEREOF

(71) Applicant: XINTEC INC., Taoyuan (TW)

(72) Inventors: Chia-Ming Cheng, New Taipei (TW); Shu-Ming Chang, New Taipei (TW)

(73) Assignee: XINTEC INC., Taoyuan (TW)

( * ) Notice: Subject to any disclaimer, the term of this patent is extended or adjusted under 35 U.S.C. 154(b) by 227 days.

(21) Appl. No.: 17/140,952

(22) Filed: Jan. 4, 2021

(65) Prior Publication Data
US 2021/0210445 A1 Jul. 8, 2021

Related U.S. Application Data

(60) Provisional application No. 62/957,600, filed on Jan. 6, 2020.

(51) Int. Cl.
| | |
|---|---|
| *H01L 23/552* | (2006.01) |
| *H01L 23/66* | (2006.01) |
| *H01L 23/31* | (2006.01) |
| *H01L 23/522* | (2006.01) |
| *H01L 23/528* | (2006.01) |
| *H01L 21/56* | (2006.01) |

(52) U.S. Cl.
CPC .......... *H01L 23/552* (2013.01); *H01L 21/565* (2013.01); *H01L 23/3135* (2013.01); *H01L 23/5226* (2013.01); *H01L 23/5286* (2013.01); *H01L 23/66* (2013.01); *H01L 2223/6605* (2013.01); *H01L 2223/6677* (2013.01)

(58) Field of Classification Search
None
See application file for complete search history.

(56) References Cited

U.S. PATENT DOCUMENTS

| | | | |
|---|---|---|---|
| 2010/0078795 A1* | 4/2010 | Dekker | H03H 9/105 257/528 |
| 2011/0079903 A1* | 4/2011 | Liu | H01L 24/03 257/E23.068 |
| 2016/0043123 A1 | 2/2016 | Chien et al. | |
| 2016/0141219 A1 | 5/2016 | Liu | |
| 2017/0053848 A1 | 2/2017 | Chang et al. | |
| 2017/0116458 A1 | 4/2017 | Liu et al. | |

(Continued)

FOREIGN PATENT DOCUMENTS

| | | |
|---|---|---|
| CN | 101213665 | 7/2008 |
| CN | 110679039 | 1/2020 |

(Continued)

*Primary Examiner* — Jay C Chang
(74) *Attorney, Agent, or Firm* — LIU & LIU

(57) ABSTRACT

A chip package includes a semiconductor substrate, a first light-transmissive sheet, a second light-transmissive sheet, a first antenna layer, and a redistribution layer. The first light-transmissive sheet is disposed over the semiconductor substrate, and has a top surface facing away from semiconductor substrate and an inclined sidewall adjacent to the top surface. The second light-transmissive sheet is disposed over the first light-transmissive sheet. The first antenna layer is disposed between the first light-transmissive sheet and the second light-transmissive sheet. The redistribution layer is disposed on the inclined sidewall of the first light-transmissive sheet, and is in contact with an end of the first antenna layer.

9 Claims, 40 Drawing Sheets

(56) References Cited

U.S. PATENT DOCUMENTS

| | | |
|---|---|---|
| 2017/0186797 A1 | 6/2017 | Long et al. |
| 2017/0301986 A1 | 10/2017 | Nguyen et al. |
| 2018/0012853 A1 | 1/2018 | Lin et al. |
| 2018/0102321 A1 | 4/2018 | Ho et al. |
| 2018/0358398 A1 | 12/2018 | Ho et al. |
| 2019/0043794 A1* | 2/2019 | Kapusta ............. H01L 21/56 |
| 2019/0074309 A1 | 3/2019 | Wang et al. |
| 2020/0203851 A1 | 6/2020 | Takaki et al. |

FOREIGN PATENT DOCUMENTS

| | | |
|---|---|---|
| EP | 3664221 | 10/2020 |
| JP | 2001-527700 | 12/2001 |
| JP | 2009-500821 | 1/2009 |
| JP | 2009-283944 | 12/2009 |
| JP | 2010-098274 | 4/2010 |
| JP | 2012-222366 | 11/2012 |
| TW | 201918138 | 5/2019 |
| WO | 2007/004137 | 1/2007 |
| WO | 2019/026913 | 2/2019 |

\* cited by examiner

CHIP PACKAGE AND MANUFACTURING METHOD THEREOF

RELATED APPLICATION

This application claims priority to US Provisional Application Ser. No. 62/957,600, filed Jan. 6, 2020, which is herein incorporated by reference in its entirety.

BACKGROUND

Field of Invention

The present invention relates to a chip package and a manufacturing method of the chip package.

Description of Related Art

In wireless communication devices, antennas may be referred as a component for sending and receiving wireless signals on wireless waves, and are one of the important components of the wireless communication devices. As wireless communication technology develops, wireless communication devices are designed towards the trends of light weight and reduced size. However, generally speaking, the antennas still need to be electrically connected to the chip on the circuit board in an external method. Therefore, electronic devices (e.g., mobile phones) still need to occupy a certain equipment space, which is disadvantageous for miniaturization.

SUMMARY

An aspect of the present invention is to provide a chip package.

According to an embodiment of the present invention, a chip package includes a semiconductor substrate, a first light-transmissive sheet, a second light-transmissive sheet, a first antenna layer, and a redistribution layer. The first light-transmissive sheet is disposed over the semiconductor substrate, and has a top surface facing away from semiconductor substrate and an inclined sidewall adjacent to the top surface. The second light-transmissive sheet is disposed over the first light-transmissive sheet. The first antenna layer is disposed between the first light-transmissive sheet and the second light-transmissive sheet. The redistribution layer is disposed on the inclined sidewall of the first light-transmissive sheet, and is in contact with an end of the first antenna layer.

In an embodiment of the present invention, the chip package further includes a shielding layer between the semiconductor substrate and the first light-transmissive sheet.

In an embodiment of the present invention, the first light-transmissive sheet has a bottom surface opposite to the top surface. The shielding layer is in contact with the bottom surface.

In an embodiment of the present invention, the chip package further includes a planarization layer covering shielding layer. The planarization layer has a bottom surface and an inclined sidewall adjacent to the bottom surface. A slope of the inclined sidewall of the planarization layer is substantially equal to a slope of the inclined sidewall of the first light-transmissive sheet.

In an embodiment of the present invention, the chip package further includes a conductive pillar between the semiconductor substrate and the redistribution layer on the bottom surface of the planarization layer.

In an embodiment of the present invention, the chip package further includes a supporting element between the semiconductor substrate and the first light-transmissive sheet. The supporting element has a bottom surface and an inclined sidewall adjacent to the bottom surface. A slope of the inclined sidewall of the supporting element is substantially equal to a slope of the inclined sidewall of the first light-transmissive sheet.

In an embodiment of the present invention, the chip package further includes the redistribution layer is disposed on the inclined sidewall of the supporting element.

In an embodiment of the present invention, a top surface of the semiconductor substrate has a conductive pad, and a sidewall of the conductive pad is in contact with the redistribution layer.

In an embodiment of the present invention, the first antenna layer is in contact with the top surface of the first light-transmissive sheet.

In an embodiment of the present invention, the semiconductor substrate has a bottom surface facing away from the first light-transmissive sheet, and the chip package further includes a planarization layer. The planarization layer covers the bottom surface of the semiconductor substrate. The planarization layer has a bottom surface and an inclined sidewall adjacent to the bottom surface. A slope of the inclined sidewall of the planarization layer is substantially equal to a slope of the inclined sidewall of the first light-transmissive sheet.

In an embodiment of the present invention, the chip package further includes a bonding layer between the first light-transmissive sheet and the semiconductor substrate. The bonding layer surrounds the semiconductor substrate. The bonding layer has a bottom surface and an inclined sidewall adjacent to the bottom surface. A slope of the inclined sidewall of the bonding layer is substantially equal to a slope of the inclined sidewall of the first light-transmissive sheet.

In an embodiment of the present invention, a bottom surface of the semiconductor substrate facing away from the top surface of the semiconductor substrate has a conductive pad. The conductive pad is disposed between the bonding layer and the planarization layer. A sidewall of the conductive pad is in contact with the redistribution layer.

In an embodiment of the present invention, the chip package further includes a molding compound surrounding the semiconductor substrate. The molding compound has a bottom surface and an inclined sidewall adjacent to the bottom surface. A slope of the inclined sidewall of the molding compound is substantially equal to a slope of the inclined sidewall of the first light-transmissive sheet.

In an embodiment of the present invention, a bottom surface of the semiconductor substrate has a conductive pad. The molding compound has an opening. The conductive pad is disposed in the opening. The redistribution layer extends to the conductive pad in the opening.

In an embodiment of the present invention, the chip package further includes a second antenna layer on a top surface of the second light-transmissive sheet.

In an embodiment of the present invention, the chip package further includes a protective layer covering the second light-transmissive sheet and the second antenna layer.

An aspect of the present invention is to provide a manufacturing method of a chip package.

According to an embodiment of the present invention, the manufacturing method of a chip package includes following steps. A first antenna layer is formed on a top surface of a first light-transmissive sheet. A second light-transmissive sheet is bonded to the top surface of the first light-transmissive sheet such that the first antenna layer is disposed between the first light-transmissive sheet and the second light-transmissive sheet. The first light-transmissive sheet is bonded to a top surface of a semiconductor substrate. A cutting process is performed such that the first light-transmissive sheet has an inclined sidewall and an end of the first antenna layer is exposed. A redistribution layer is formed on the inclined sidewall of the first light-transmissive sheet such that the redistribution layer is in contact with the end of the first antenna layer.

In an embodiment of the present invention, the manufacturing method of the chip package further includes forming a shielding layer on a bottom surface of the first light-transmissive sheet.

In an embodiment of the present invention, the manufacturing method of the chip package further includes forming a supporting element on a top surface of the semiconductor substrate. The supporting element is disposed between the semiconductor substrate and the first light-transmissive sheet.

In an embodiment of the present invention, the manufacturing method of the chip package further includes forming a planarization layer over the semiconductor substrate. The cutting process is performed such that the planarization layer simultaneously forms an inclined sidewall. A slope of the inclined sidewall of the planarization layer is substantially equal to a slope of the inclined sidewall of the first light-transmissive sheet.

In an embodiment of the present invention, the manufacturing method of the chip package further includes forming a bonding layer over the semiconductor substrate and surrounding the semiconductor substrate. The cutting process is performed such that the bonding layer simultaneously forms an inclined sidewall. A slope of the inclined sidewall of the bonding layer is substantially equal to a slope of the inclined sidewall of the first light-transmissive sheet.

In an embodiment of the present invention, the manufacturing method of the chip package further includes following steps. A molding compound is formed on a bottom surface of the first light-transmissive sheet and surrounding the semiconductor substrate, in which the cutting process is performed such that the molding compound simultaneously forms an inclined sidewall, and in which a slope of the inclined sidewall of the molding compound is substantially equal to a slope of the inclined sidewall of the first light-transmissive sheet. An opening is formed in the molding compound such that a conductive pad of the semiconductor substrate is exposed, in which the redistribution layer extends to the conductive pad in the opening.

In an embodiment of the present invention, the manufacturing method of the chip package further includes forming a second antenna layer on a top surface of the second light-transmissive sheet.

In an embodiment of the present invention, the manufacturing method of the chip package further includes forming a protective layer over the second light-transmissive sheet and surrounding the second antenna layer.

In the aforementioned embodiments of the present invention, since the chip package includes the first antenna layer between the first light-transmissive sheet and the second light-transmissive sheet, and the first light-transmissive sheet has a top surface facing away from semiconductor substrate and an inclined sidewall adjacent to the top surface, the redistribution layer can be formed on the inclined sidewall of the first light-transmissive sheet, thereby in contact with an end of the first antenna layer. As a result, the miniaturization of the antenna and the chip package containing the antenna can be achieved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
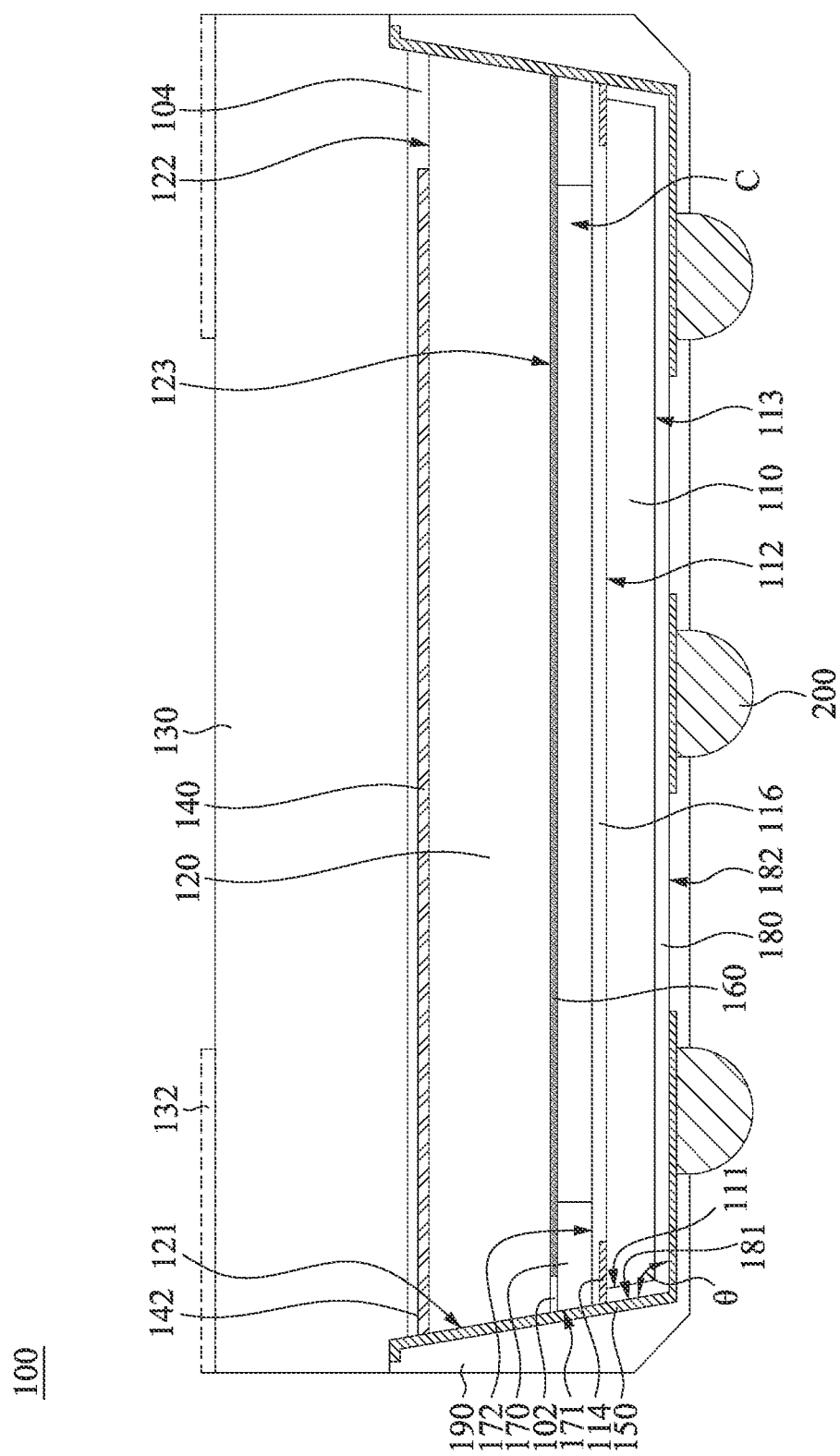
FIG. 1 is a cross-sectional view of a chip package according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a chip package 100 according to one embodiment of the present invention. The chip package 100 includes a semiconductor substrate 110, a first light-transmissive sheet 120, a second light-transmissive sheet 130, an antenna layer 140, and a redistribution layer 150. The first light-transmissive sheet 120 is disposed over the semiconductor substrate 110, and the first light-transmissive sheet 120 has a top surface 122 facing away from semiconductor substrate 110 and an inclined sidewall 121 adjacent to the top surface 122. The second light-transmissive sheet 130 is disposed over the first light-transmissive sheet 120. The antenna layer 140 is disposed between the first light-transmissive sheet 120 and the second light-transmissive sheet 130. The redistribution layer 150 is disposed on the inclined sidewall 121 of the first light-transmissive sheet 120, and the redistribution layer 150 is in contact with an end 142 of the antenna layer 140.

In the present embodiment, the chip package 100 may be used for high frequency signal transmission, for example 5G communication. Transmission frequency of the antenna layer 140 may be in a range from 30 GHz to 300 GHz, and the semiconductor substrate 110 may be a radio frequency device. Moreover, the semiconductor substrate 110 may be made of silicon. The first light-transmissive sheet 120 and the second light-transmissive sheet 130 may be made of the same material. The first light-transmissive sheet 120 and the second light-transmissive sheet 130 may include glass, fused silica, quartz glass, sapphire, or a combination thereof. The redistribution layer 150 may include copper, silver or aluminum, and the antenna layer 140 may include copper or silver. Both of the redistribution layer 150 and the antenna layer 140 may be formed by performing physical vapor deposition (e.g., sputtering). As a result, the antenna layer 140 may be directly formed on the top surface 122 of the first light-transmissive sheet 120 such that the antenna layer 140 is in direct contact with the top surface 122 of the first light-transmissive sheet 120.

In the present embodiments, the redistribution layer 150 is formed on the inclined sidewall 121 of the first light-transmissive sheet 120, thereby in contact with the end 142 of the antenna layer 140. As a result, the miniaturization of the antenna and the chip package 100 containing the antenna can be achieved.

In some embodiments, the chip package 100 further includes a shielding layer 160. The shielding layer 160 is disposed between the semiconductor substrate 110 and the first light-transmissive sheet 120. The first light-transmissive sheet 120 has a bottom surface 123 opposite to the top surface 122. The shielding layer 160 may be formed on the bottom surface 123 of the first light-transmissive sheet 120 by performing physical vapor deposition (e.g., sputtering). As a result, the shielding layer 160 may be in direct contact with the bottom surface 123 of the first light-transmissive sheet 120. The shielding layer 160 can prevent radio frequency (RF) signals from interfering with the semiconductor substrate 110.

In some embodiments, the semiconductor substrate 110 has an inclined sidewall 111, a top surface 112 and a bottom surface 113. The inclined sidewall 111 is adjacent to the top surface 112, and the bottom surface 113 faces away from the first light-transmissive sheet 120. The top surface 112 of the semiconductor substrate 110 has a conductive pad 114. The conductive pad 114 protrudes from the inclined sidewall 111 of the semiconductor substrate 110, and thus the redistribution layer 150 is in contact with the conductive pad 114. The top surface 112 of the semiconductor substrate 110 is covered by an insulating layer 116. The semiconductor substrate 110 may have an inductance below the insulating layer 116.

In some embodiments, the chip package 100 further includes a supporting element 170. The supporting element 170 is disposed between the semiconductor substrate 110 and the first light-transmissive sheet 120. In other words, the supporting element 170 is disposed between the semiconductor substrate 110 and the shielding layer 160. The supporting element 170 can prevent the shielding layer 160 from interfering and coupling with the inductance under the insulating layer 116. The supporting element 170 has a bottom surface 172 and an inclined sidewall 171 adjacent to the bottom surface 172, and a slope of the inclined sidewall 171 of the supporting element 170 is substantially equal to a slope of the inclined sidewall 121 of the first light-transmissive sheet 120. The redistribution layer 150 is disposed on the inclined sidewall 171 of the supporting element 170. In some embodiments, a cavity C is disposed between the shielding layer 160 and the semiconductor substrate 110, and the supporting element 170 surrounds the cavity C. A portion of the shielding layer 160 faces toward the cavity C, and the other portions of the shielding layer 160 faces toward the supporting element 170.

In some embodiments, the chip package 100 further includes a planarization layer 180. The planarization layer 180 covers a bottom surface of the conductive pad 114. In greater details, the planarization layer 180 covers the bottom surface 113 of the semiconductor substrate 110. The planarization layer 180 has a bottom surface 182 and an inclined sidewall 181 adjacent to the bottom surface 182, and a slope of the inclined sidewall 181 of the planarization layer 180 is substantially equal to the slope of the inclined sidewall 121 of the first light-transmissive sheet 120. The redistribution layer 150 is disposed on the inclined sidewall 181 of the planarization layer 180 and the bottom surface 182 of the planarization layer 180. In other words, the redistribution layer 150 may extend to the bottom surface 182 of the planarization layer 180 through the inclined sidewall 181 of the planarization layer 180 from the inclined sidewall 171 of the supporting element 170, and thus the redistribution layer 150 has a blunt angle θ.

In some embodiments, the chip package 100 further includes a passivation layer 190 and a conductive structure 200. The passivation layer 190 covers the redistribution layer 150 and the planarization layer 180. The passivation layer 190 may have an opening configured to dispose the conductive structure 200 on a bottom surface of the redistribution layer 150. The conductive structure 200 may be a solder ball or a conductive pillar, and the present invention is not limited in this regard. The conductive structure 200 may be electrically connected to other electronic devices (e.g., circuit boards).

In some embodiments, the chip package 100 further includes a bonding layer 102 and a bonding layer 104. The bonding layer 102 is disposed between the supporting element 170 and the first light-transmissive sheet 120, and the bonding layer 102 is configured to adhere the supporting element 170 and the first light-transmissive sheet 120. The bonding layer 104 is disposed between the first light-transmissive sheet 120 and the second light-transmissive sheet 130, and the bonding layer 104 is configured to adhere the first light-transmissive sheet 120 and the second light-transmissive sheet 130.

Moreover, the chip package 100 may optionally include a metal layer 132. The metal layer 132 is formed on a top surface of the second light-transmissive sheet 130 to increase bandwidth of the antenna layer 140. The metal layer 132 may be optionally disposed on the top surface of the second light-transmissive sheet 130 in the following embodiments, depending on the designer's needs.

It is to be noted that the connection relationship, materials, and advantages of the aforementioned elements will not be repeated. In the following description, a manufacturing method of the chip package 100 will be described.

Figure 2:
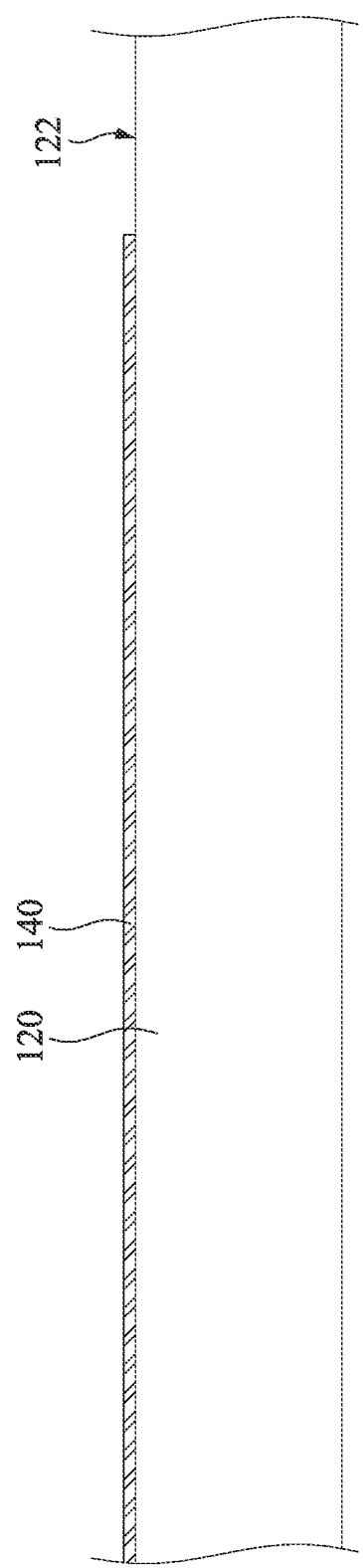
FIG. 2 to FIG. 11 are cross-sectional views at various stages of a manufacturing method of the chip package in FIG. 1.

FIG. 2 to FIG. 11 are cross-sectional views at various stages of a manufacturing method of the chip package 100 in FIG. 1. Referring to FIG. 2, the antenna layer 140 is formed on the top surface 122 of the first light-transmissive sheet 120. The method of forming the antenna layer 140 may include forming a conductive layer (e.g., by sputtering) on the entire top surface 122 of the first light-transmissive sheet 120, and then patterning the conductive layer to form the antenna layer 140. The process of patterning the conductive layer may include exposure, development, etching, and other suitable processes.

Figure 3:
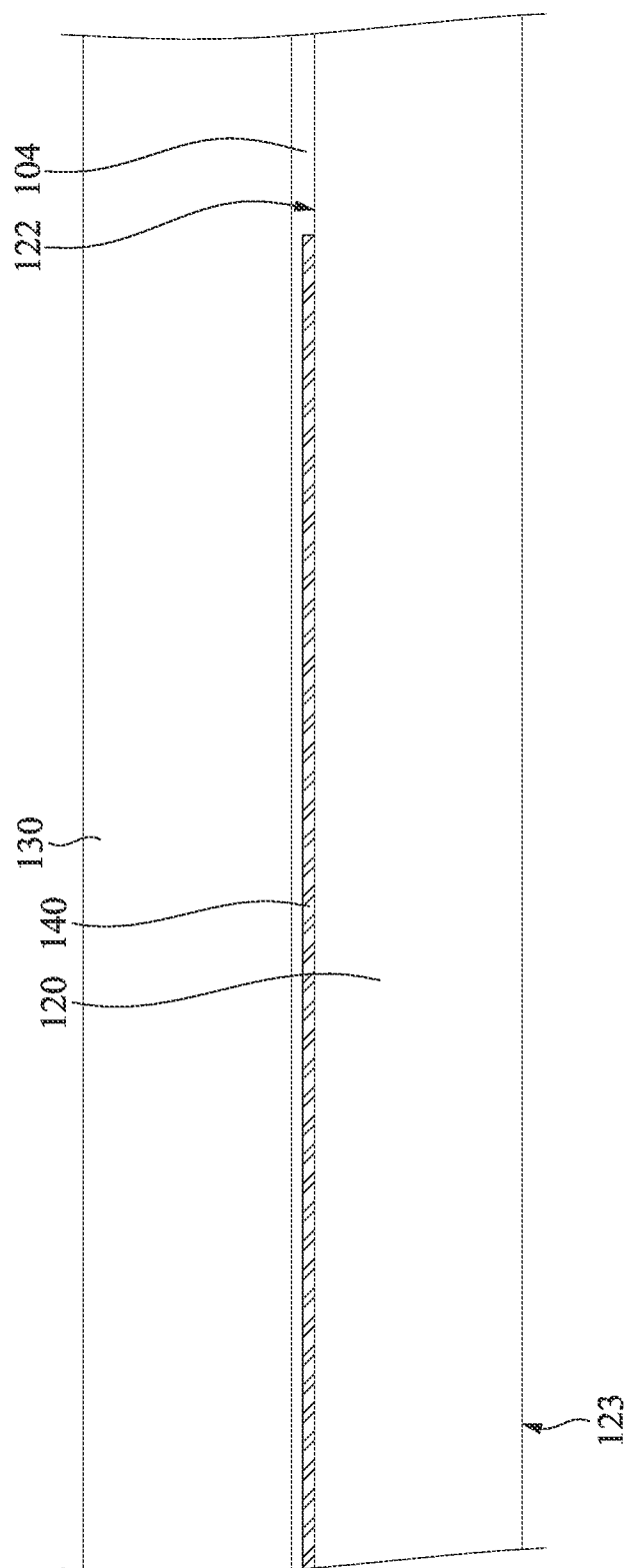
Figure 4:
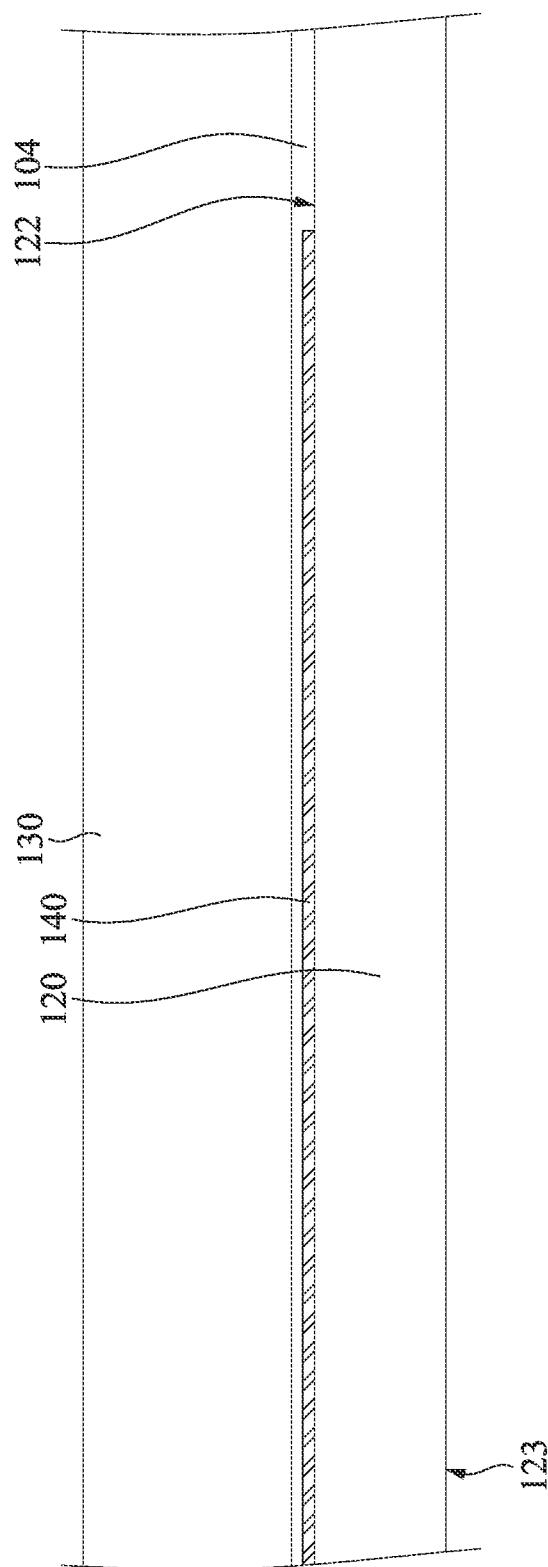
Figure 5:
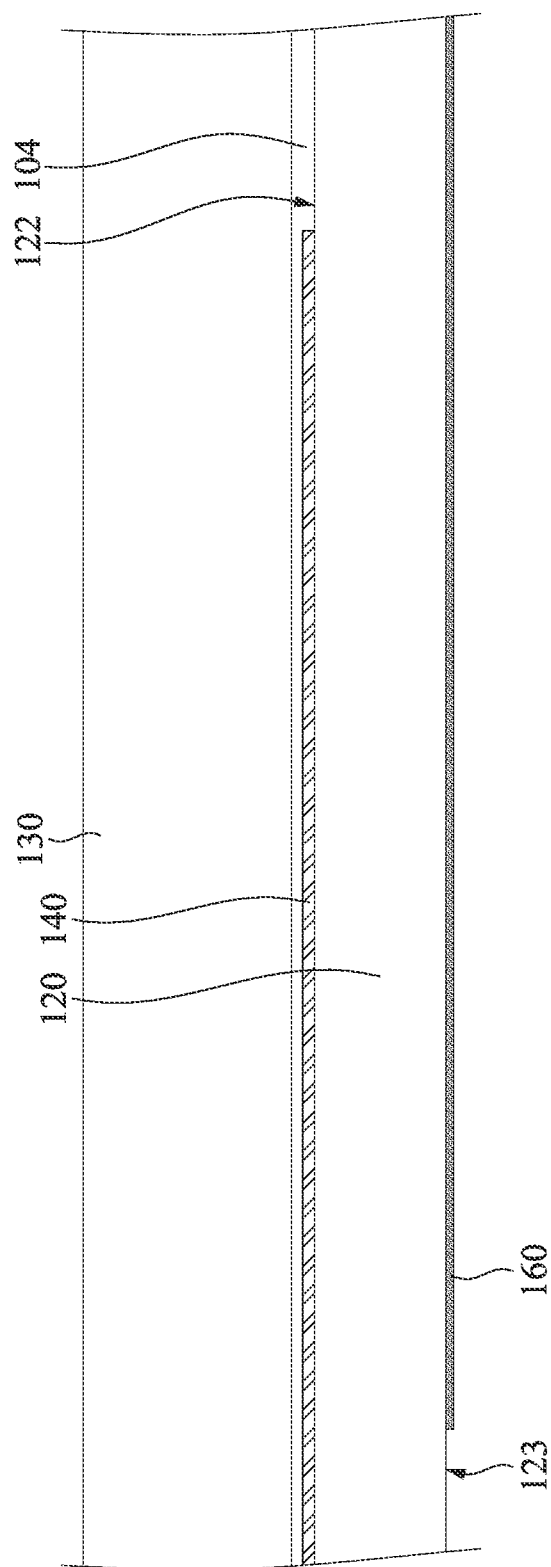

Referring to FIG. 3 to FIG. 5, the second light-transmissive sheet 130 may be bonded to the top surface 122 of the first light-transmissive sheet 120 such that the antenna layer 140 is disposed between the first light-transmissive sheet 120 and the second light-transmissive sheet 130. For example, the second light-transmissive sheet 130 is bonded to the top surface 122 of the first light-transmissive sheet 120 by using the bonding layer 104. Thereafter, the first light-transmissive sheet 120 may be thinned, for example, the bottom surface 123 of the first light-transmissive sheet 120 is polished. A thickness of the first light-transmissive sheet 120 may be smaller than 200 micrometers (um). As a result, the structure of FIG. 4 is obtained. Referring to FIG. 5, the shielding layer 160 is formed on the bottom surface 123 of the first light-transmissive sheet 120. The method of forming the shielding layer 160 may include forming a conductive layer (e.g., by sputtering) on the entire bottom surface 123 of the first light-transmissive sheet 120, and then patterning the conductive layer to form the shielding layer 160. By using the above-mentioned steps, the structure of FIG. 5 is obtained.

Figure 6:
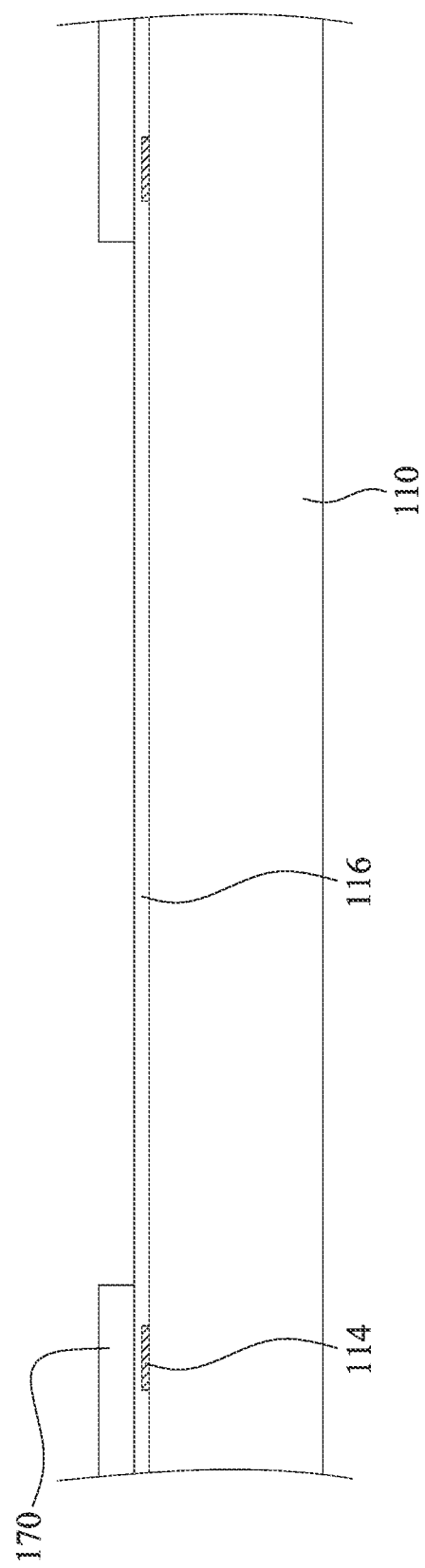

Referring to FIG. 6, in some embodiments, the supporting element 170 is formed on the semiconductor substrate 110. In greater details, the semiconductor substrate 110 may have a conductive pad 114 and an insulating layer 116, and the supporting element 170 covers the conductive pad 114 and the insulating layer 116. Prior to forming the supporting element 170 on the semiconductor substrate 110, a cleaning treatment may be performed on the semiconductor substrate 110. It is noted that the semiconductor substrate 110 in FIG. 6 to FIG. 11 has not been cut yet and is at a wafer level, while the semiconductor substrate 110 in FIG. 1 has undergone the cutting process in FIG. 11 and is at a chip scale.

Figure 7:
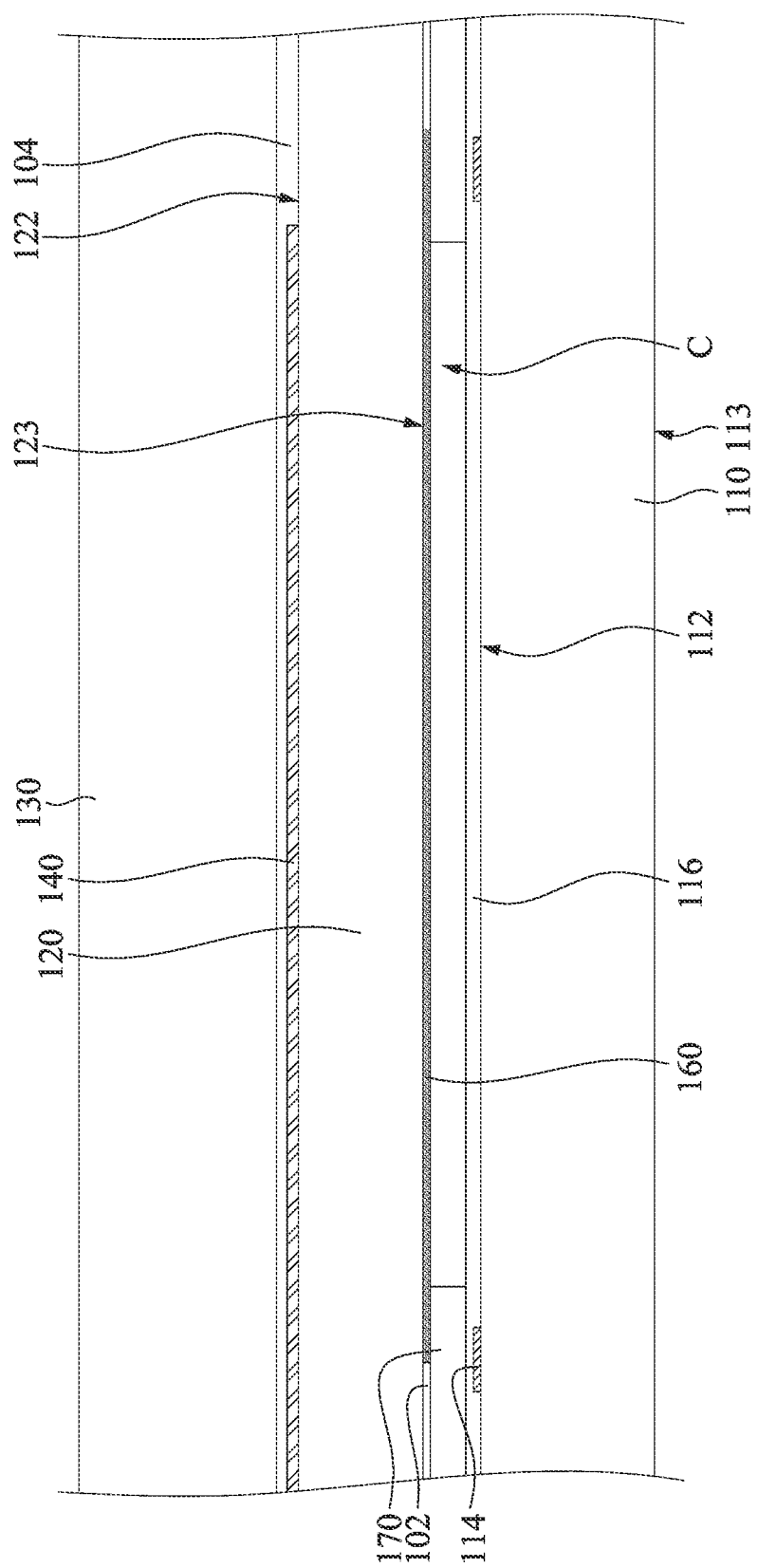

Referring to FIG. 7, next, the first light-transmissive sheet 120 of FIG. 5 is bonded to the top surface 112 of the semiconductor substrate 110. For example, the first light-transmissive sheet 120 is boned to the top surface 112 of the semiconductor substrate 110 by using the bonding layer 102. After the structure of FIG. 7 is completed, the semiconductor substrate 110 may be thinned, for example, the bottom surface 113 of the semiconductor substrate 110 is polished.

Figure 8:
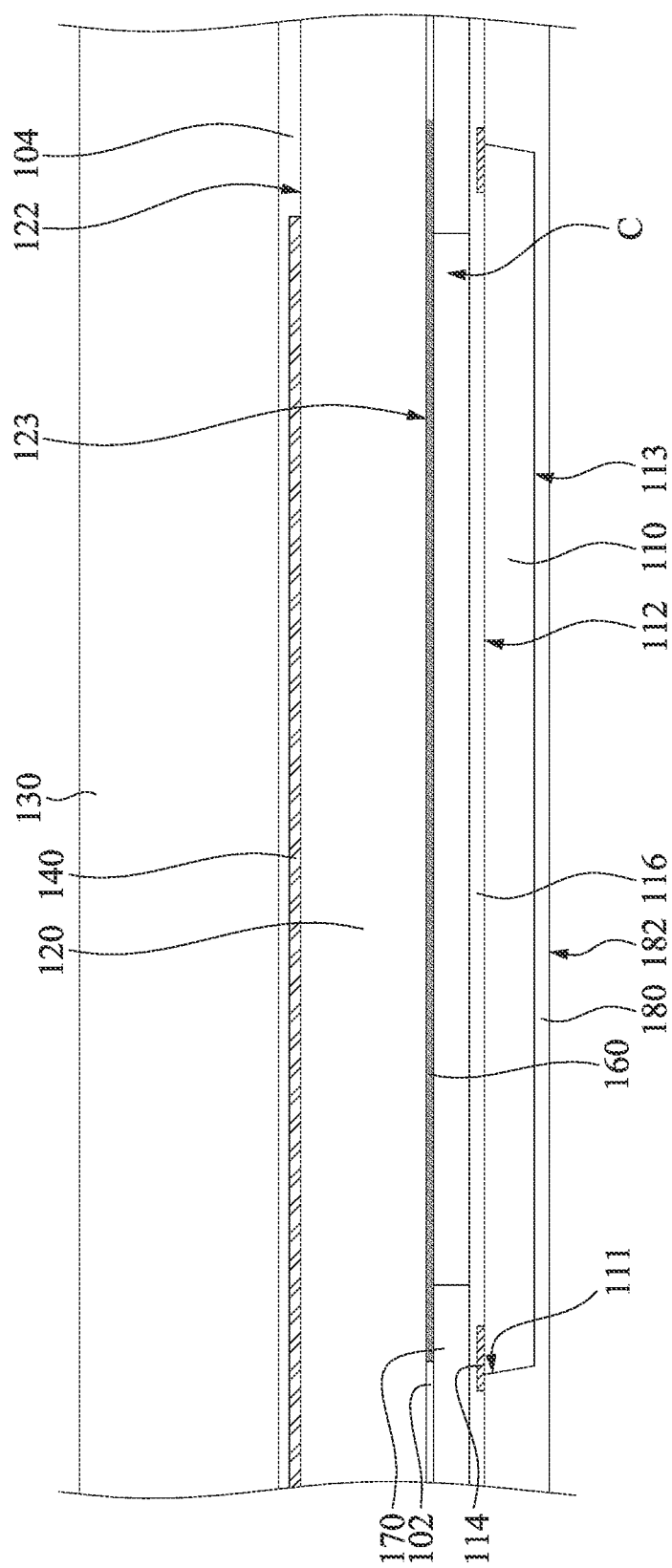

Referring to FIG. 8, the bottom surface 113 of the semiconductor substrate 110 may be etched such that the semiconductor substrate 110 may have an inclined sidewall 111, and the conductive pad 114 may protrude from the inclined sidewall 111. Thereafter, a planarization layer 180 may be formed on the inclined sidewall 111 and the bottom surface 113 of the semiconductor substrate 110, and the planarization layer 180 is also formed on a bottom surface of the conductive pad 114.

Figure 9:
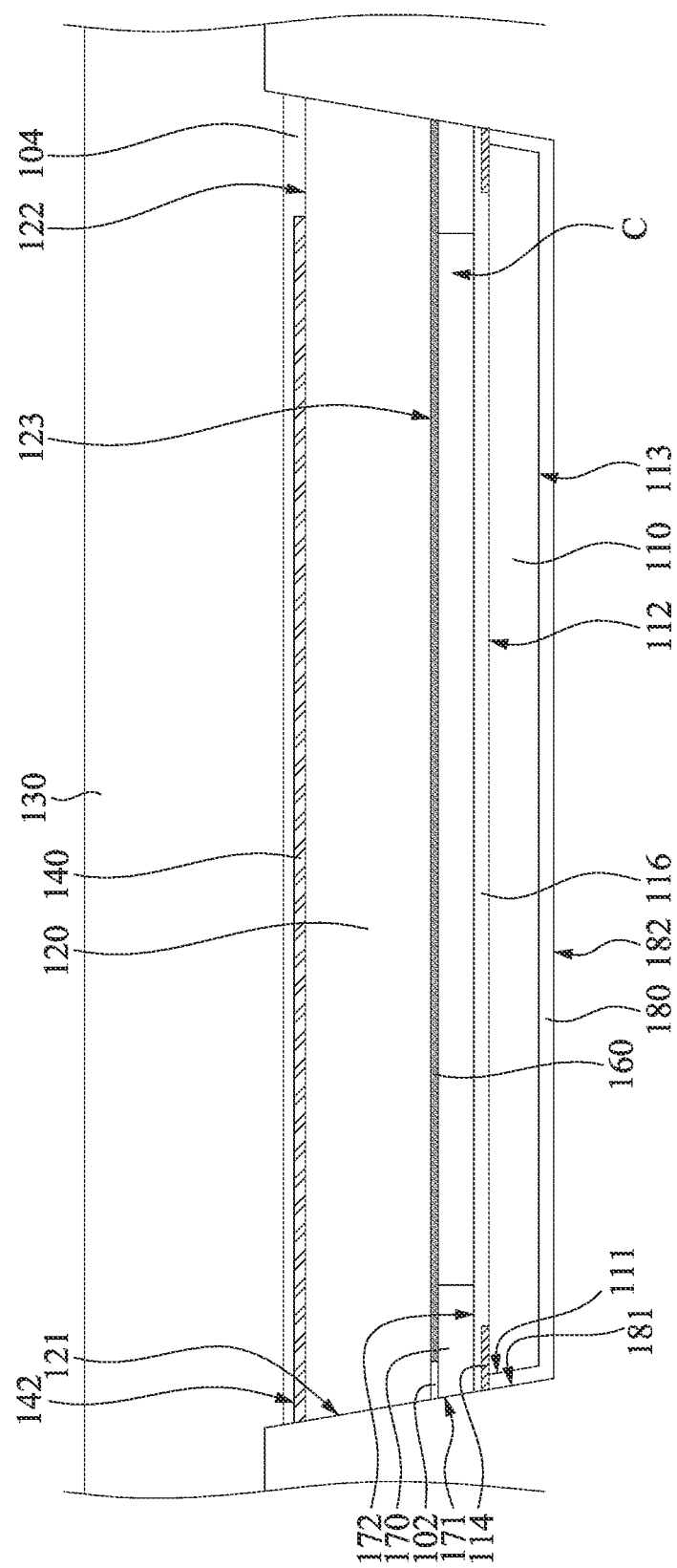

Referring to FIG. 9, next, a cutting process may be performed such that the first light-transmissive sheet 120 has the inclined sidewall 121 and an end 142 of the antenna layer 140 is exposed. The cutting process may be performed with a cutting tool (cutting knife). During the cutting process, the planarization layer 180 may simultaneously form the inclined sidewall 181. Since the cutting process may be performed with a single cutting tool, the slope of the inclined sidewall 181 of the planarization layer 180 may be substantially equal to the slope of the inclined sidewall 121 of the first light-transmissive sheet 120. Moreover, the slope of the inclined sidewall 171 of the supporting element 170 and a slope of a sidewall of the conductive pad 114 of the semiconductor substrate 110 may be substantially equal to the slope of the inclined sidewall 121 of the first light-transmissive sheet 120. This design may benefit the stability of the subsequent redistribution layer 150 (see FIG. 10).

Figure 10:
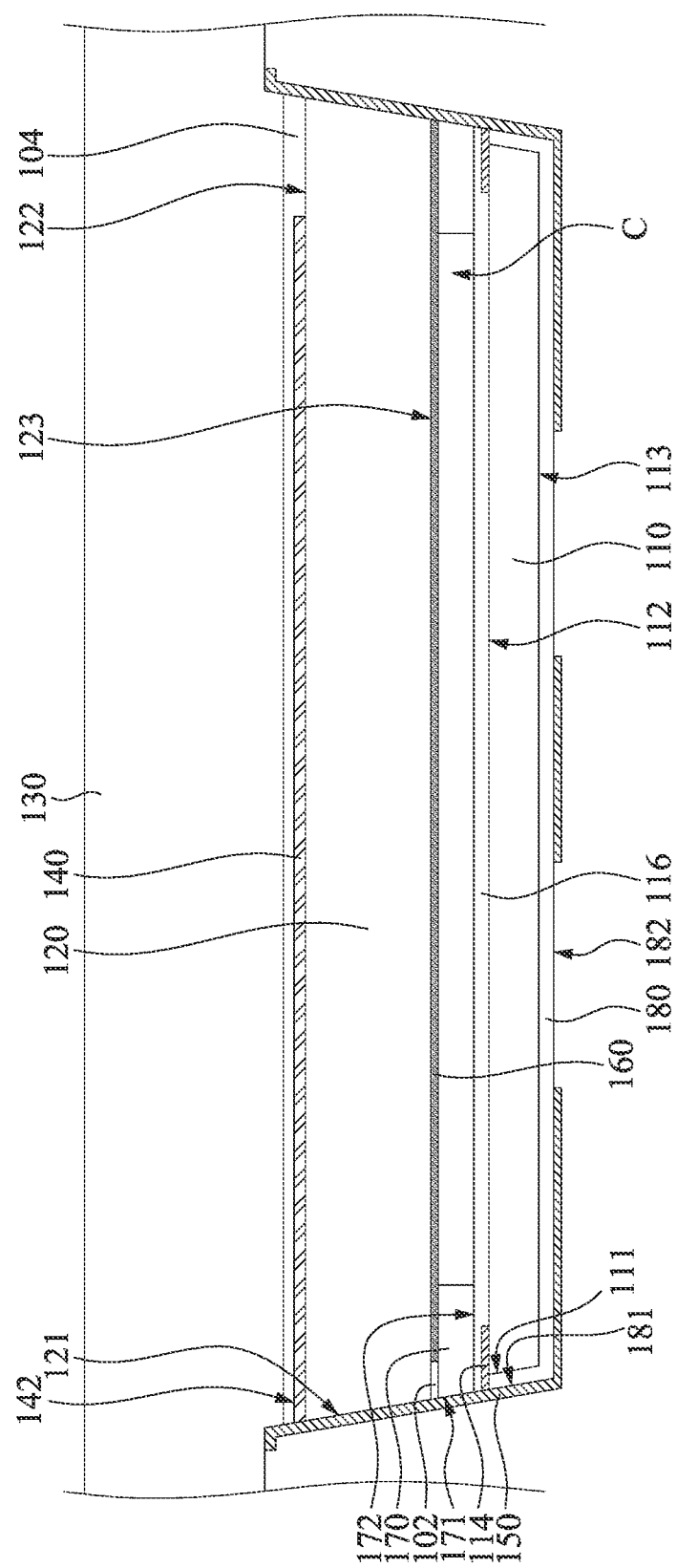

Referring to FIG. 10, after the structure in FIG. 9 is formed, the redistribution layer 150 is formed on the inclined sidewall 121 of the first light-transmissive sheet 120, the sidewall of the conductive pad 114, the inclined sidewall 181 of the planarization layer 180, and the bottom surface 182 of the planarization layer 180, such that the redistribution layer 150 is in contact with the sidewall of the conductive pad 114 and the end 142 of the antenna layer 140. As such, the electrical connection between the semiconductor substrate 110 and the antenna layer 140 can be achieved.

Figure 11:
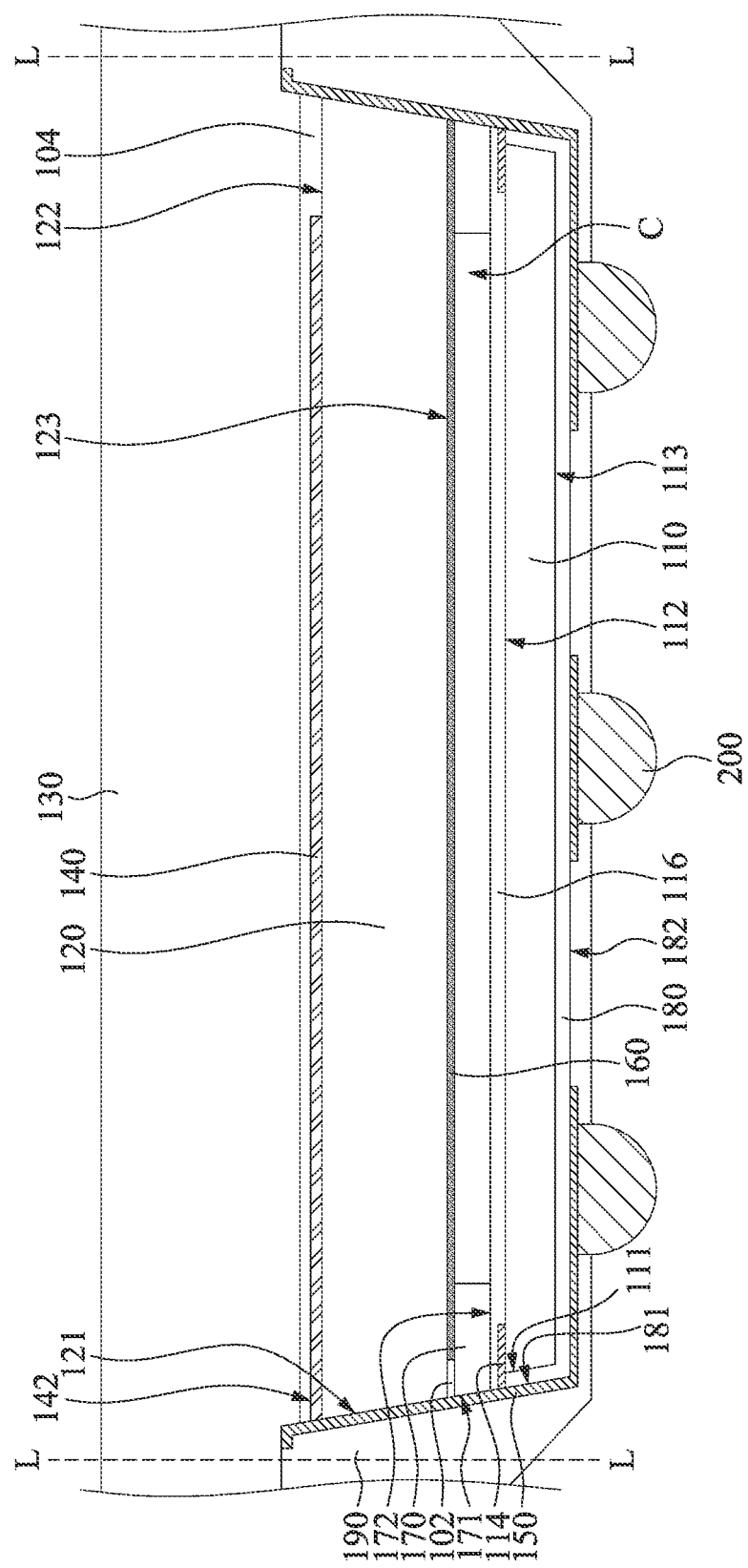

Referring to FIG. 11, in the subsequent processes, a passivation layer 190 may be formed to cover the redistribution layer 150 and the planarization layer 180. Thereafter, the passivation layer 190 may be patterned such that the passivation layer 190 on the bottom surface 182 of the planarization layer 180 may form an opening that exposes the redistribution layer 150. Next, the conductive structure 200 may be disposed on the opening of the redistribution layer 150. The conductive structure 200 may be configured to electrically connect to other electronic devices (e.g., circuit boards). Then, the cutting process may be performed along a line L to obtain the chip package 100 in FIG. 1.

Figure 12:
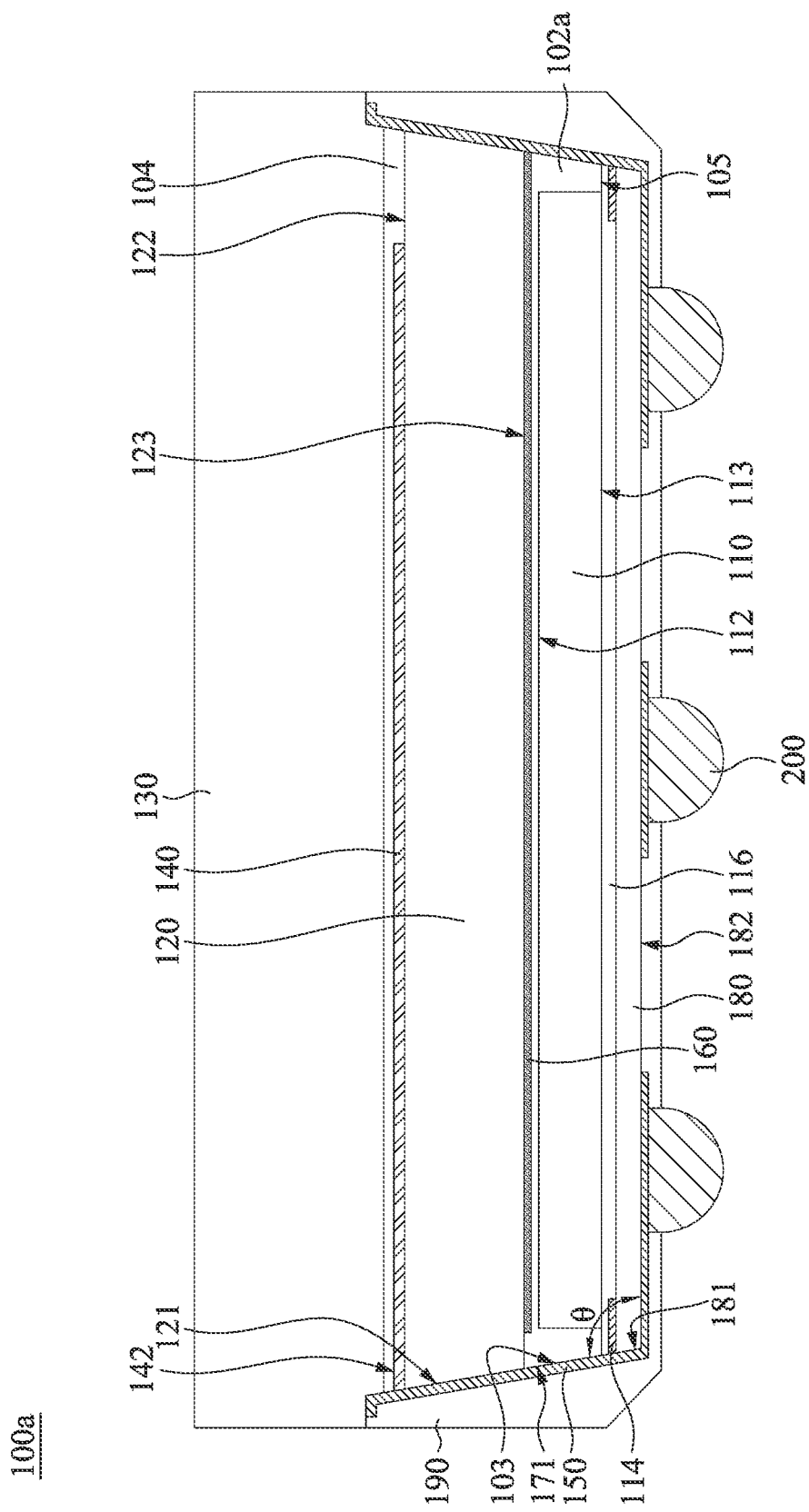
FIG. 12 is a cross-sectional view of the chip package according to another embodiment of the present invention.

FIG. 12 is a cross-sectional view of the chip package 100a according to another embodiment of the present invention. The chip package 100a includes the semiconductor substrate 110, the first light-transmissive sheet 120, the second light-transmissive sheet 130, the antenna layer 140, the redistribution layer 150, and a bonding layer 102a. Compared to the embodiment in FIG. 1, the bonding layer 102a of the chip package 100a is disposed between the first light-transmissive sheet 120 and the semiconductor substrate 110, and the bonding layer 102a surrounds the semiconductor substrate 110. The bonding layer 102a has a bottom surface 105 and an inclined sidewall 103 adjacent to the bottom surface 105, and a slope of the inclined sidewall 103 of the bonding layer 102a is substantially equal to the slope of the inclined sidewall 121 of the first light-transmissive sheet 120. In the present embodiment, the chip package 100a does not require the supporting element 170 in FIG. 1, which can save material and manufacturing costs. The bonding layer 102 may be in contact with the semiconductor substrate 110, the first light-transmissive sheet 120 and the shielding layer 160. For example, the bonding layer 102a may be glue.

In some embodiments, the bottom surface 113 of the semiconductor substrate 110 opposite to the top surface 112 of the semiconductor substrate 110 has a conductive pad 114. The conductive pad 114 is disposed between the bonding layer 102a and the planarization layer 180, and the sidewall of the conductive pad 114 is in contact with the redistribution layer 150.

Figure 13:
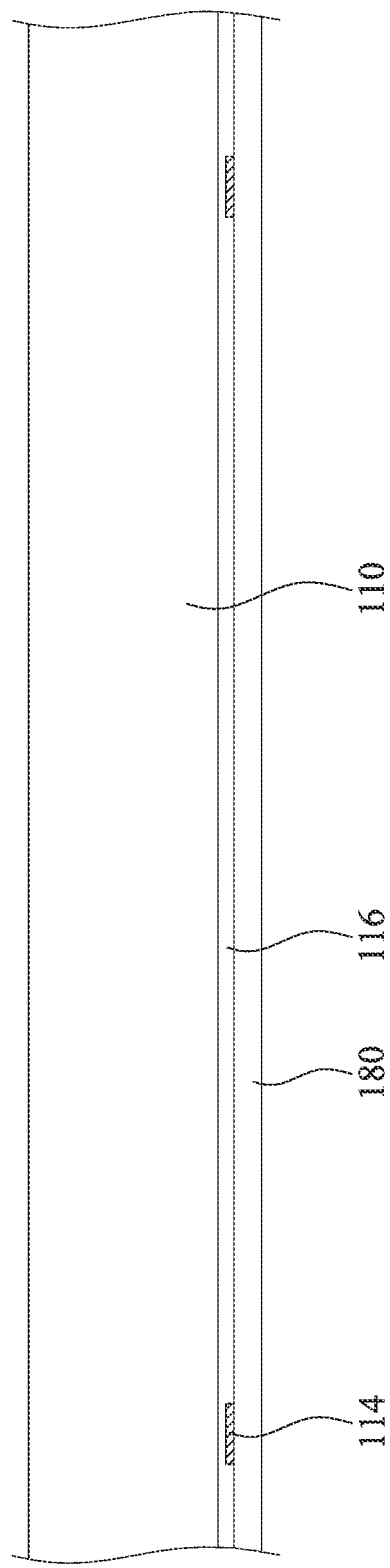
FIG. 13 to FIG. 19 are cross-sectional views at various stages of a manufacturing method of the chip package in FIG. 12.

FIG. 13 to FIG. 19 are cross-sectional views at various stages of a manufacturing method of the chip package 100a in FIG. 12. For clarify, the steps of forming the antenna layer 140 over the first light-transmissive sheet 120, bonding the second light-transmissive sheet 130 on the first light-transmissive sheet 120, thinning the first light-transmissive sheet 120, forming the shielding layer 160 over the bottom surface 123 of the first light-transmissive sheet 120, and/or other steps are similar to the steps in FIG. 2 to FIG. 5, so the description is not repeated hereinafter. Referring to FIG. 13, the planarization layer 180 is formed on the bottom surface of the semiconductor substrate 110.

Figure 14:
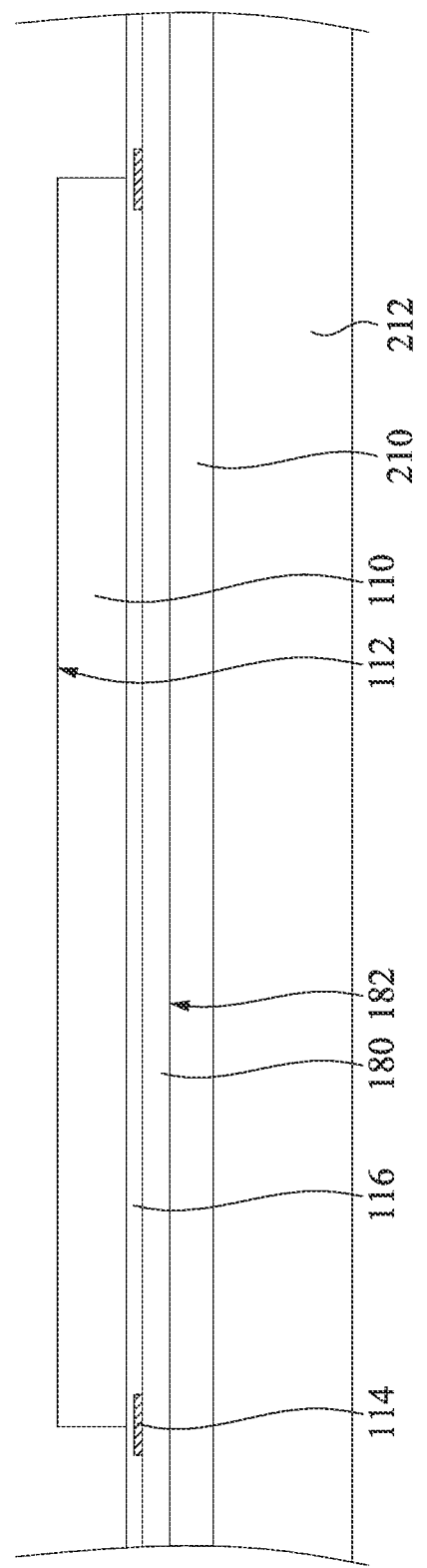

Referring to FIG. 14, a temporary adhesive layer 210 is used on the bottom surface 182 of the planarization layer 180 to be bonded to the carrier 212. Thereafter, the semiconductor substrate 110 may be thinned, and both sides of the semiconductor substrate 110 may be etched to expose the insulating layer 116.

Figure 15:
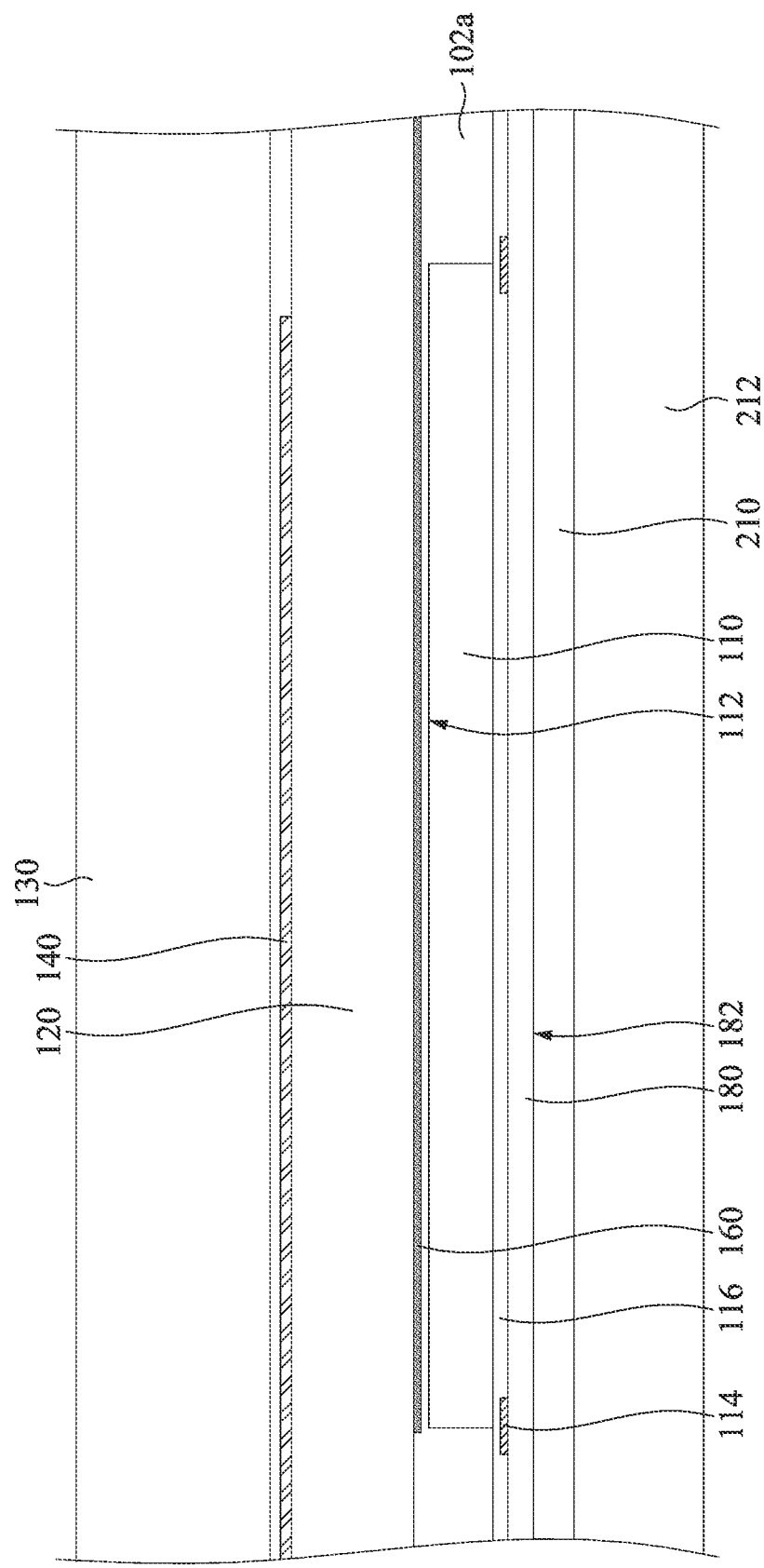

Referring to FIG. 15, the first light-transmissive sheet 120 in FIG. 5 is bonded to the top surface 112 of the semiconductor substrate 110. For example, the first light-transmissive sheet 120 may be bonded to the top surface 112 of the semiconductor substrate 110 by using the bonding layer 102a.

Figure 16:
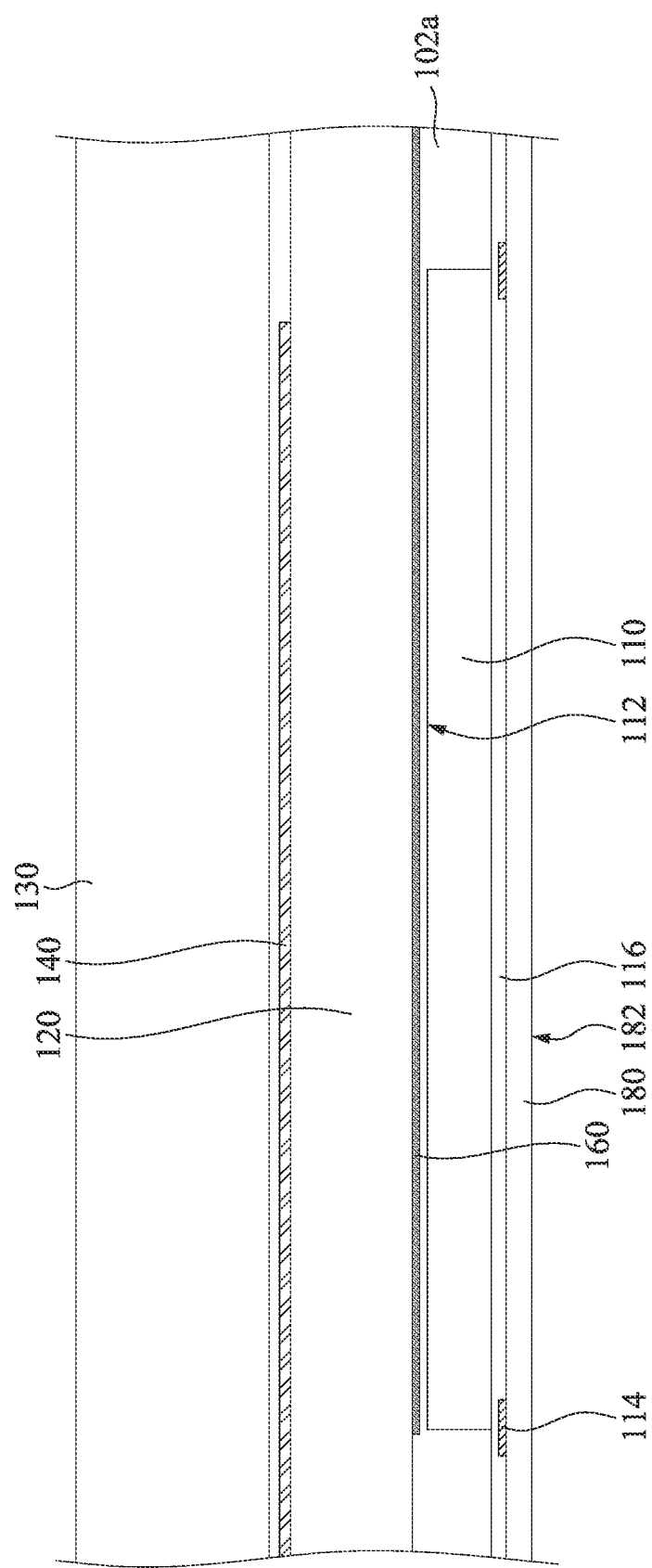
Figure 17:
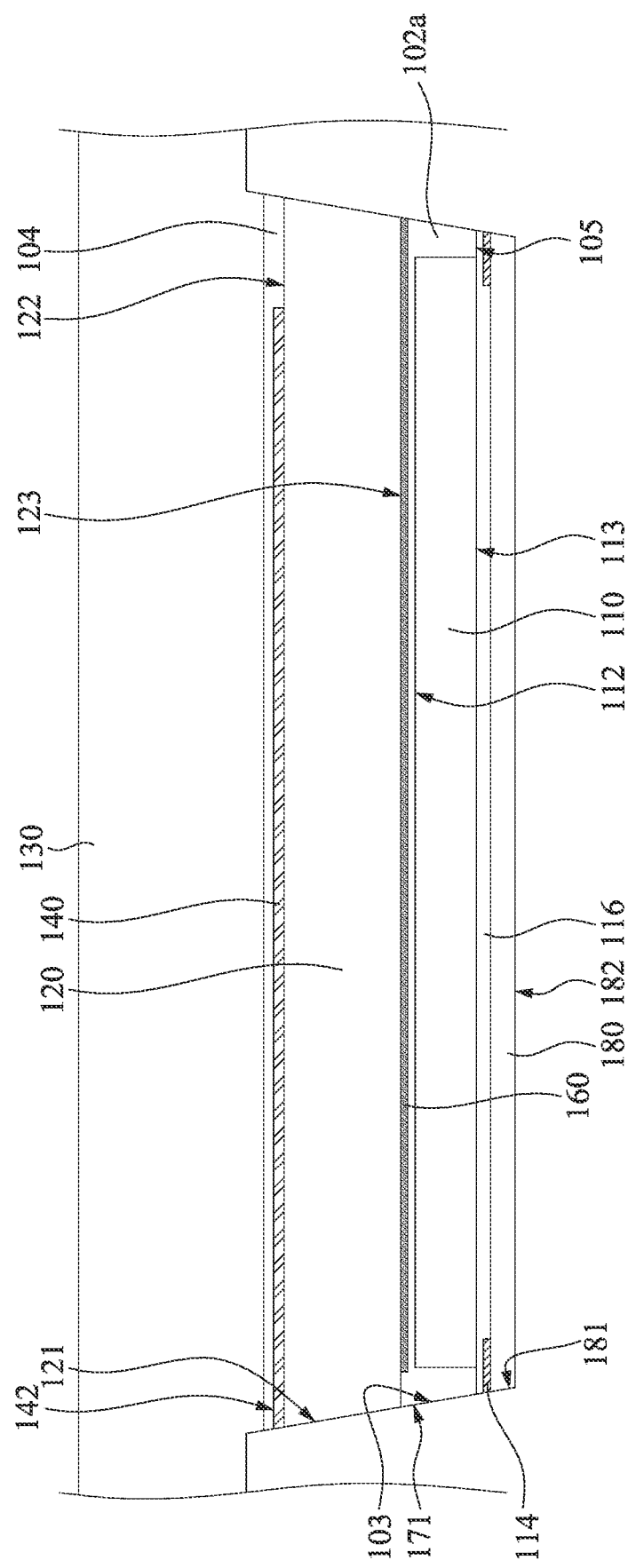

Referring to FIG. 16 and FIG. 17, the temporary adhesive layer 210 and the carrier 212 are removed from the bottom surface 182 of the planarization layer 180. Thereafter, a cutting process may be performed such that the first light-transmissive sheet 120 has the inclined sidewall 121 and the end 142 of the antenna layer 140 is exposed. The cutting process may be performed with a cutting tool (cutting knife). During the cutting process, the planarization layer 180 may simultaneously form the inclined sidewall 181. Since the cutting process may be performed with a single cutting tool, the slope of the inclined sidewall 181 of the planarization layer 180 may be substantially equal to the slope of the inclined sidewall 121 of the first light-transmissive sheet 120. Moreover, the cutting process is performed such that the bonding layer 102a may simultaneously form the inclined sidewall 103, and the conductive pad 114 of the semiconductor substrate 110 may form a sidewall. The slope of the inclined sidewall 103 of the bonding layer 102a and the sidewall of the conductive pad 114 may be substantially equal to the slope of the inclined sidewall 121 of the first light-transmissive sheet 120. This design may benefit the stability of the subsequent redistribution layer 150 (see FIG. 18).

Figure 18:
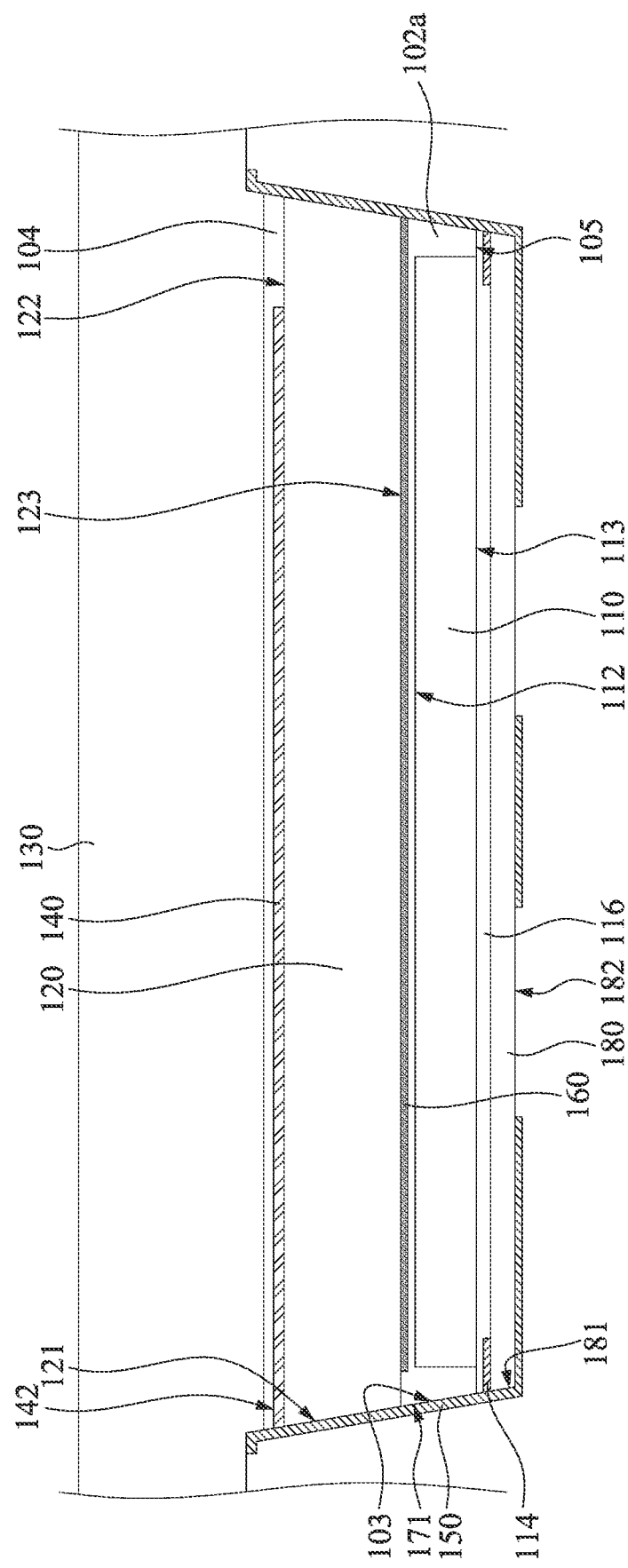

Referring to FIG. 18, after the structure in FIG. 17 is formed, the redistribution layer 150 is formed on the inclined sidewall 121 of the first light-transmissive sheet 120, the sidewall of the conductive pad 114, the inclined sidewall 181 of the planarization layer 180, and the bottom surface 182 of the planarization layer 180, such that the redistribution layer 150 is in contact with the sidewall of the conductive pad 114 and the end 142 of the antenna layer 140. As such, the electrical connection between the semiconductor substrate 110 and the antenna layer 140 can be achieved.

Figure 19:
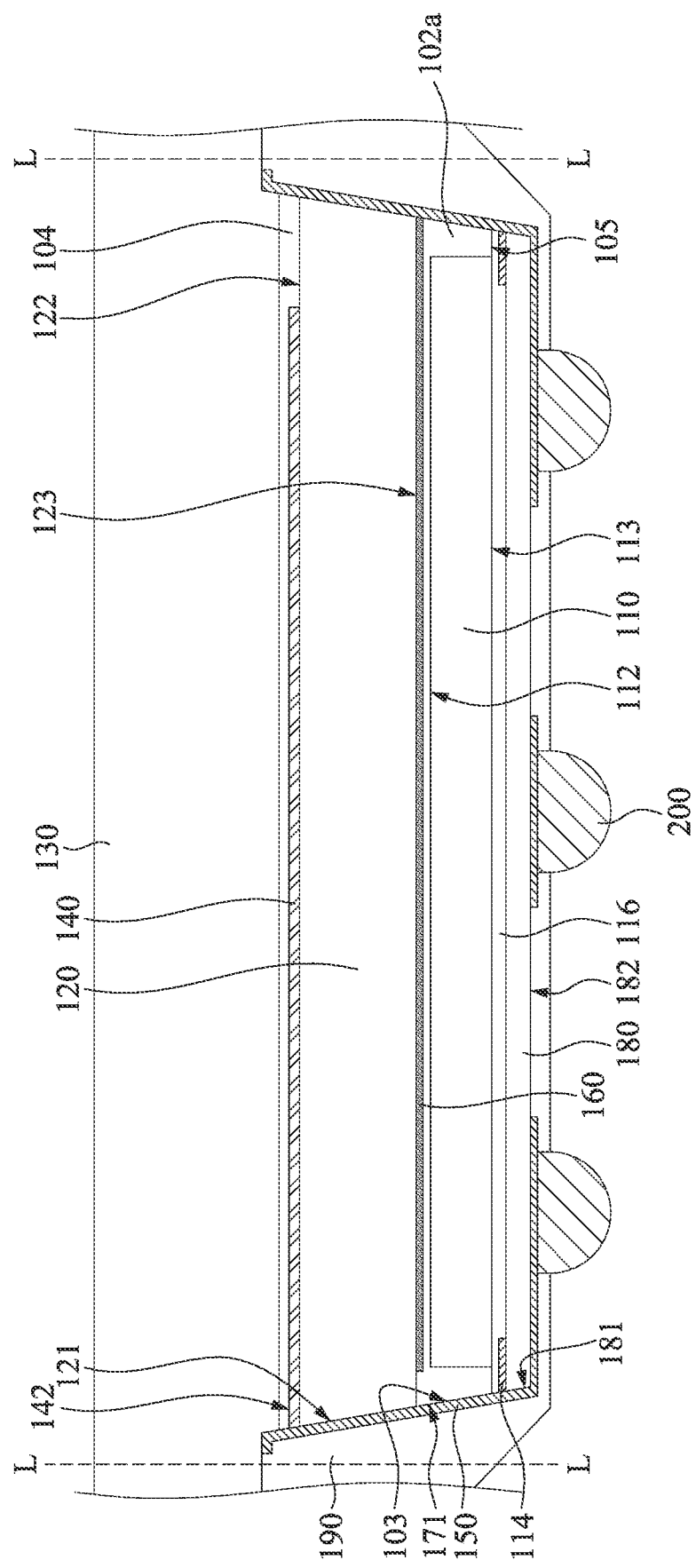

Referring to FIG. 19, in the subsequent processes, the passivation layer 190 may be formed to cover the redistribution layer 150 and the planarization layer 180. Thereafter, the passivation layer 190 may be patterned such that the passivation layer 190 on the bottom surface 182 of the planarization layer 180 may form the opening that exposes the redistribution layer 150. Next, the conductive structure 200 may be disposed on the opening of the redistribution layer 150. The conductive structure 200 may be configured to electrically connect to other electronic devices (e.g., circuit boards). Then, the cutting process may be performed along the line L to obtain the chip package 100a in FIG. 12.

Figure 20:
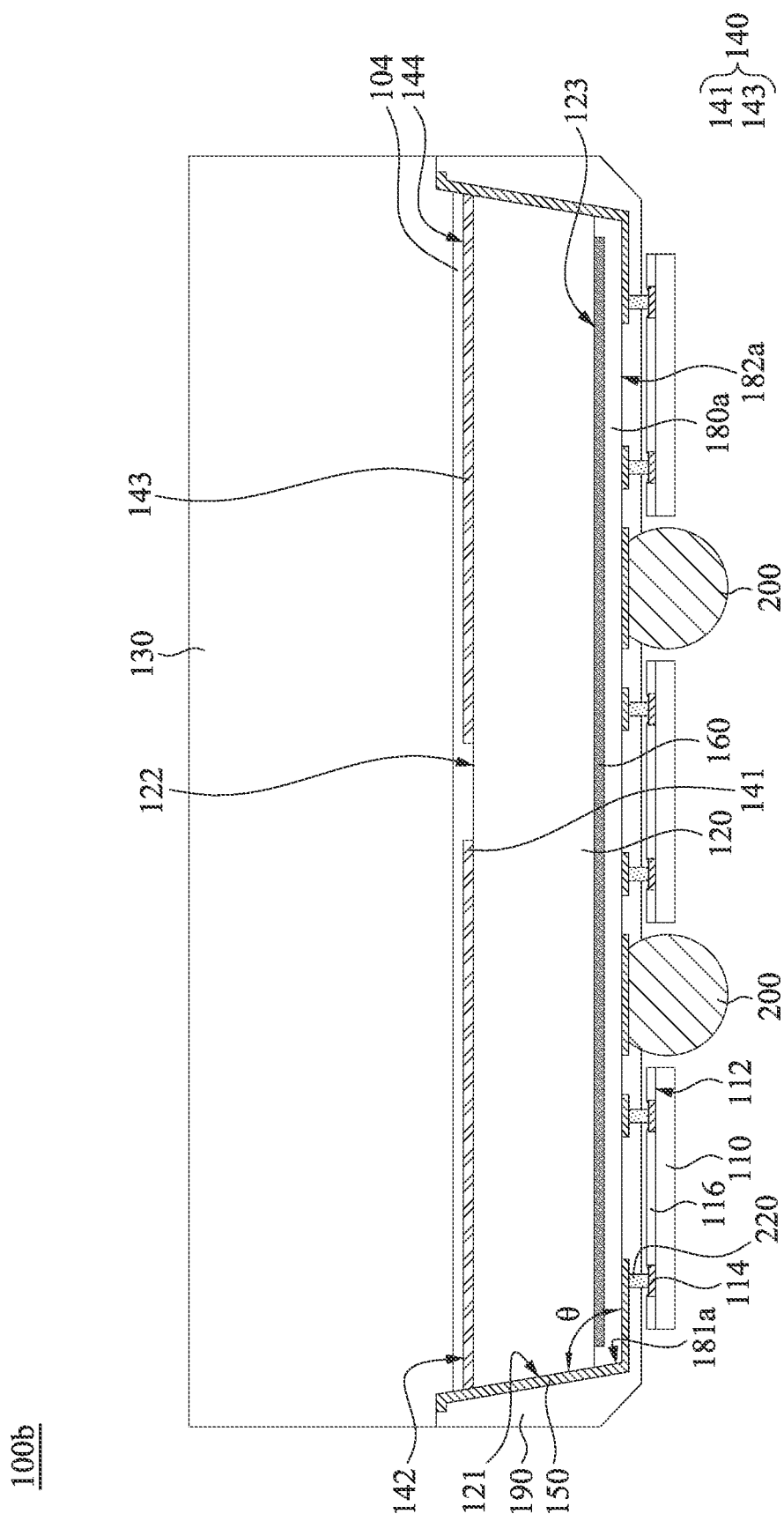
FIG. 20 is a cross-sectional view of the chip package according to another embodiment of the present invention.

FIG. 20 is a cross-sectional view of the chip package 100b according to another embodiment of the present invention. The chip package 100b includes the semiconductor substrate 110, the first light-transmissive sheet 120, the second light-transmissive sheet 130, the antenna layer 140, the redistribution layer 150, a planarization layer 180a, and a conductive pillar 220. Compared to the embodiment in FIG. 1, the antenna layer 140 includes a first portion 141 and a second portion 143. In other words, in the present embodiment, the antenna layer 140 is an antenna array. The number of the semiconductor substrate 110 is three in FIG. 20, but the present invention is not limited in this regard. The semiconductor substrate 110 is disposed outside the passivation layer 190 and disposed below the first light-transmissive sheet 120, the redistribution layer 150 and the passivation layer 190. Furthermore, the planarization layer 180a covers the shielding layer 160. The planarization layer 180a has a bottom surface 182a and an inclined sidewall 181a adjacent to the bottom surface 182a, and a slope of the inclined sidewall 181a of the planarization layer 180a is substantially equal to the slope of the inclined sidewall 121 of the first light-transmissive sheet 120. Moreover, the conductive pillar 220 is disposed between the semiconductor substrate 110 and the redistribution layer 150 on the bottom surface 182a of the planarization layer 180a. In the present embodiment, the conductive pillar 220 is in contact with the redistribution layer 150 and the conductive pad 114 of the semiconductor substrate 110. In other words, a portion of the redistribution layer 150 is disposed on the bottom surface 182a of the planarization layer 180a, and is electrically connected to the conductive pad 114 of the semiconductor substrate 110 through the conductive pillar 220.

Figure 21:
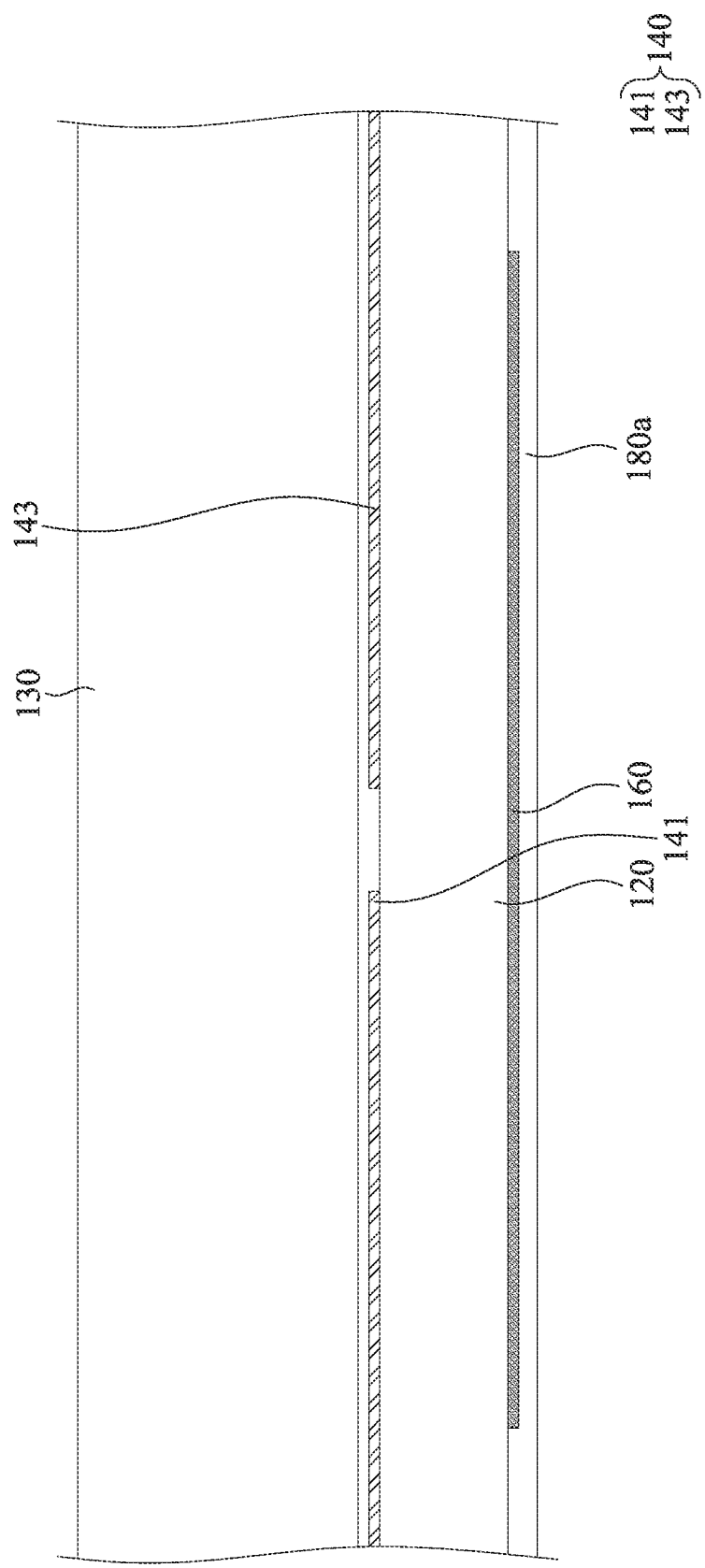
FIG. 21 to FIG. 29 are cross-sectional views at various stages of a manufacturing method of the chip package in FIG. 20.

FIG. 21 to FIG. 29 are cross-sectional views at various stages of a manufacturing method of the chip package 100b in FIG. 20. For clarify, the steps of forming the antenna layer 140 over the first light-transmissive sheet 120, bonding the second light-transmissive sheet 130 on the first light-transmissive sheet 120, thinning the first light-transmissive sheet 120, forming the shielding layer 160 over the bottom surface 123 of the first light-transmissive sheet 120, and/or other steps are similar to the steps in FIG. 2 to FIG. 5, so the description is not repeated hereinafter. Referring to FIG. 21, the planarization layer 180a is formed on the shielding layer 160 and the bottom surface of the first light-transmissive sheet 120. In other words, the planarization layer 180a covers the shielding layer 160 and the first light-transmissive sheet 120.

Figure 22:
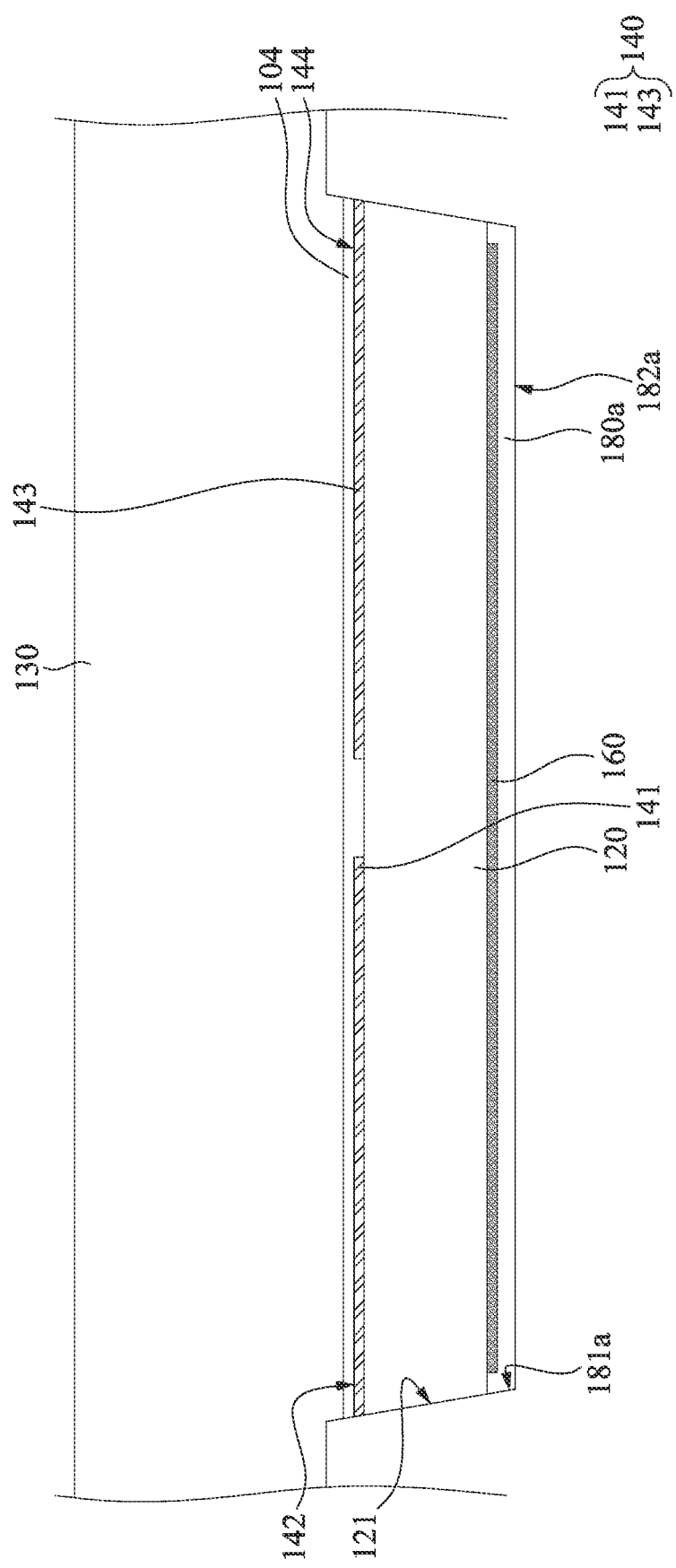

Referring to FIG. 22, a cutting process may be performed such that the first light-transmissive sheet 120 has the inclined sidewall 121 and an end 142 of the antenna layer 140 is exposed. In greater details, the end 142 of the first portion 141 of the antenna layer 140 and an end 144 of the second portion 143 of the antenna layer 140 are exposed. The cutting process may be performed with a cutting tool (cutting knife). During the cutting process, the planarization layer 180a may simultaneously form the inclined sidewall 181a. Since the cutting process may be performed with a single cutting tool, the slope of the inclined sidewall 181a of the planarization layer 180a may be substantially equal to the slope of the inclined sidewall 121 of the first light-transmissive sheet 120. This design may benefit the stability of the subsequent redistribution layer 150 (see FIG. 23).

Figure 23:
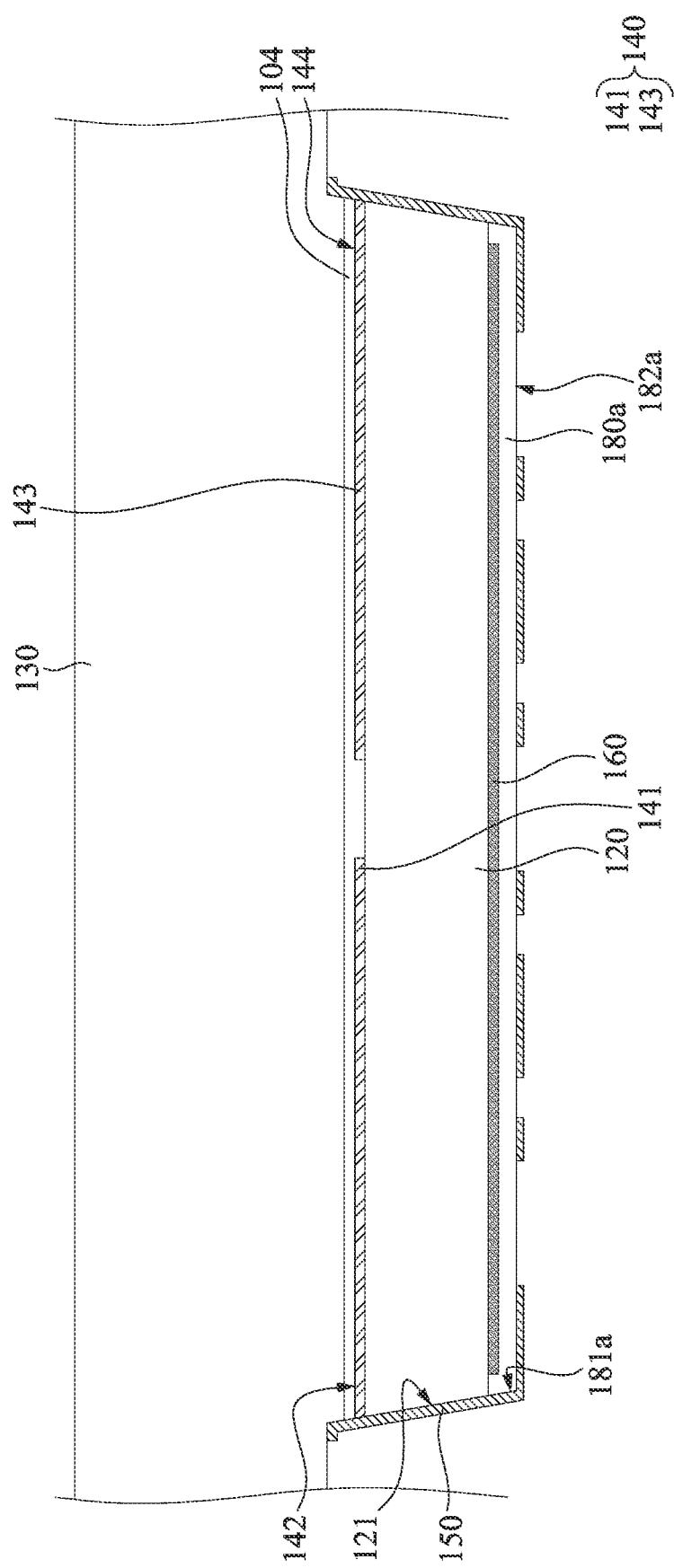

Referring to FIG. 23, after the structure in FIG. 22 is formed, the redistribution layer 150 is formed on the inclined sidewall 121 of the first light-transmissive sheet 120, the inclined sidewall 181a of the planarization layer 180a, and the bottom surface 182a of the planarization layer 180a, such that the redistribution layer 150 is in contact with the end 142 of the first portion 141 of the antenna layer 140 and the end 144 of the second portion 143 of the antenna layer 140.

Figure 24:
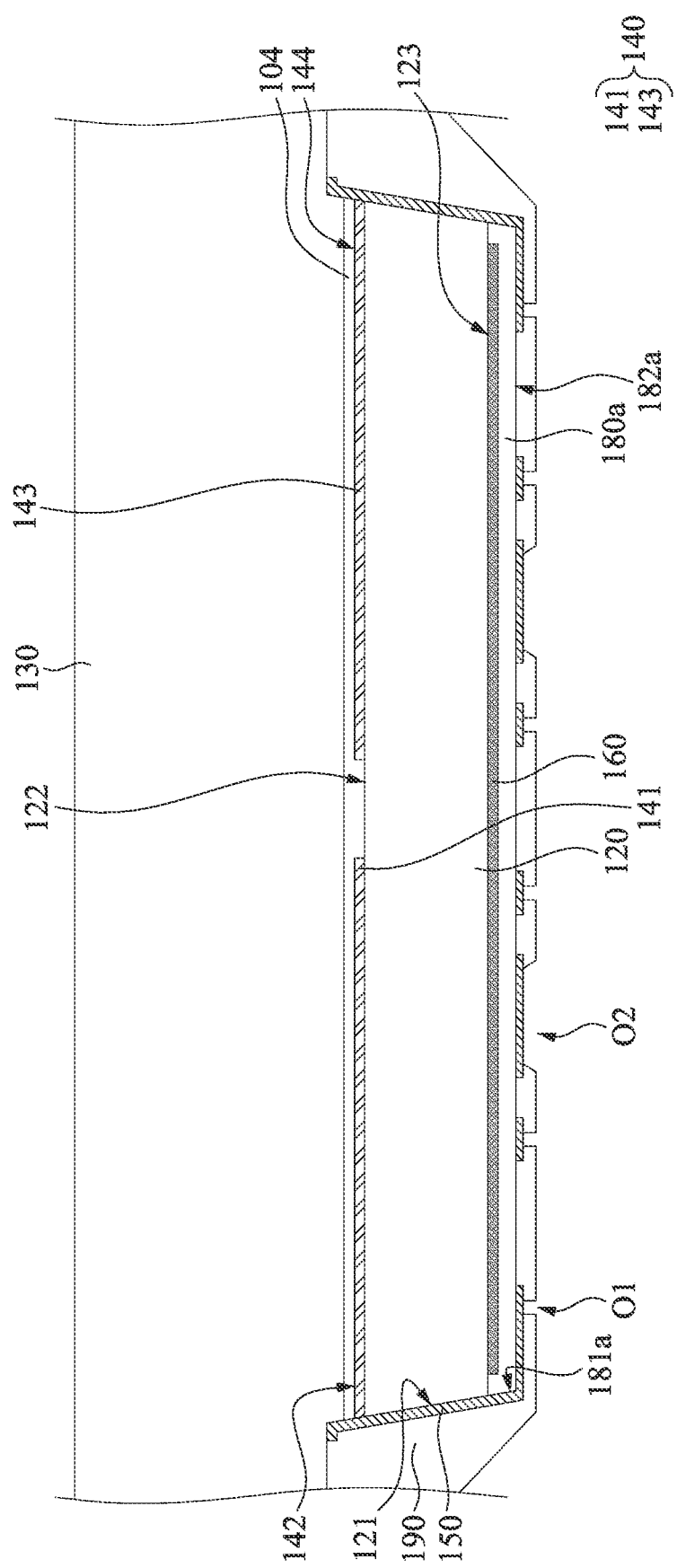

Referring to FIG. 24, in the subsequent processes, the passivation layer 190 may be formed to cover the redistribution layer 150 and the planarization layer 180a. Thereafter, the passivation layer 190 may be patterned such that the passivation layer 190 on the bottom surface 182a of the planarization layer 180a may form openings O1 and O2 that exposes the redistribution layer 150.

Figure 25:
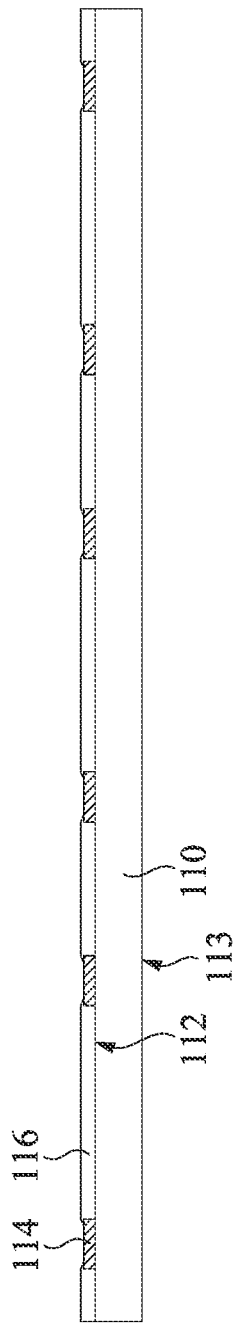
Figure 26:
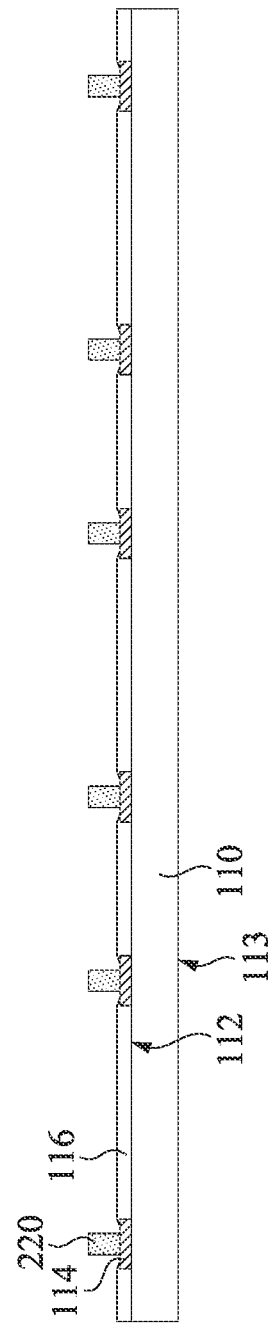
Figure 27:
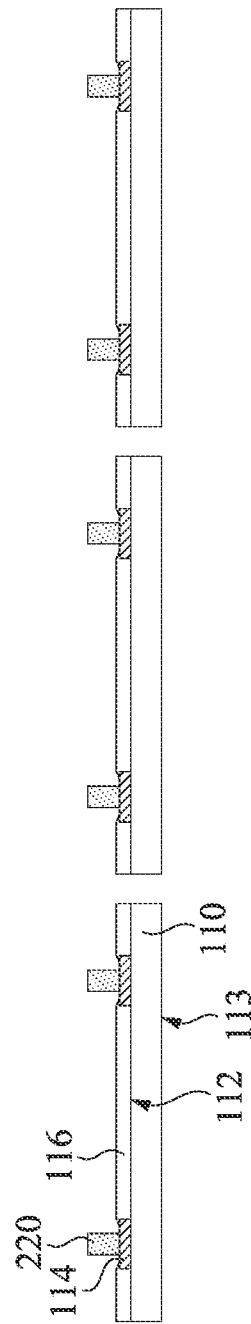

Referring to FIG. 25, FIG. 26, and FIG. 27, the top surface 112 of the semiconductor substrate 110 has the conductive pad 114, and the top surface 112 of the semiconductor substrate 110 is covered by the insulating layer 116. Thereafter, the semiconductor substrate 110 may be thinned, for example, the bottom surface 113 of the semiconductor substrate 110 is polished. Then, the conductive pillar 220 is formed on the conductive pad 114 of the semiconductor substrate 110. In the present embodiment, the conductive pillar 220 is in contact with the conductive pad 114 of the semiconductor substrate 110. In some embodiments, the conductive pillar 220 is made of copper (Cu), and tin (Sn) or silver (Ag) is electroplated thereon. As shown in FIG. 27, after the conductive pillar 220 is formed, the semiconductor substrate 110 may be cut into a plurality of sub-portions to form the semiconductor substrate 110 in FIG. 20.

Figure 28:
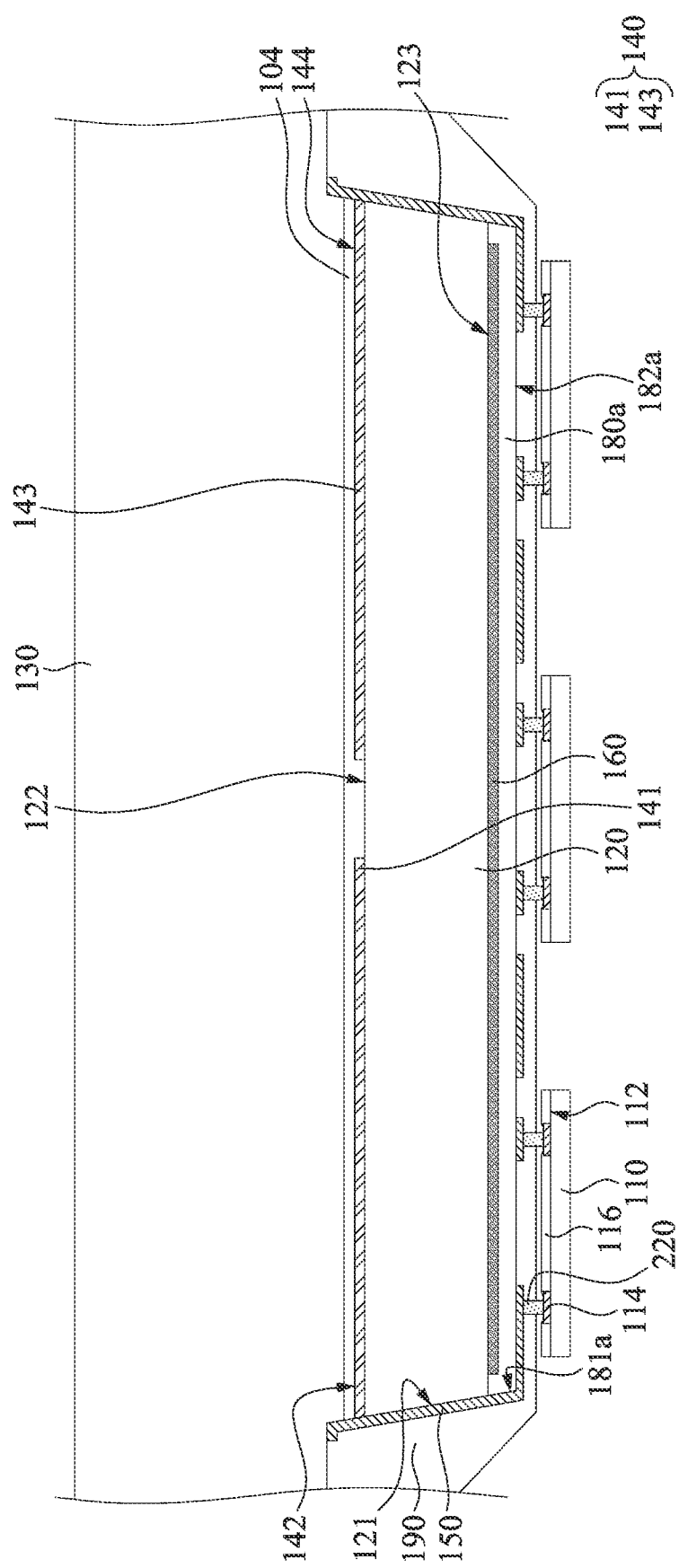
Figure 29:
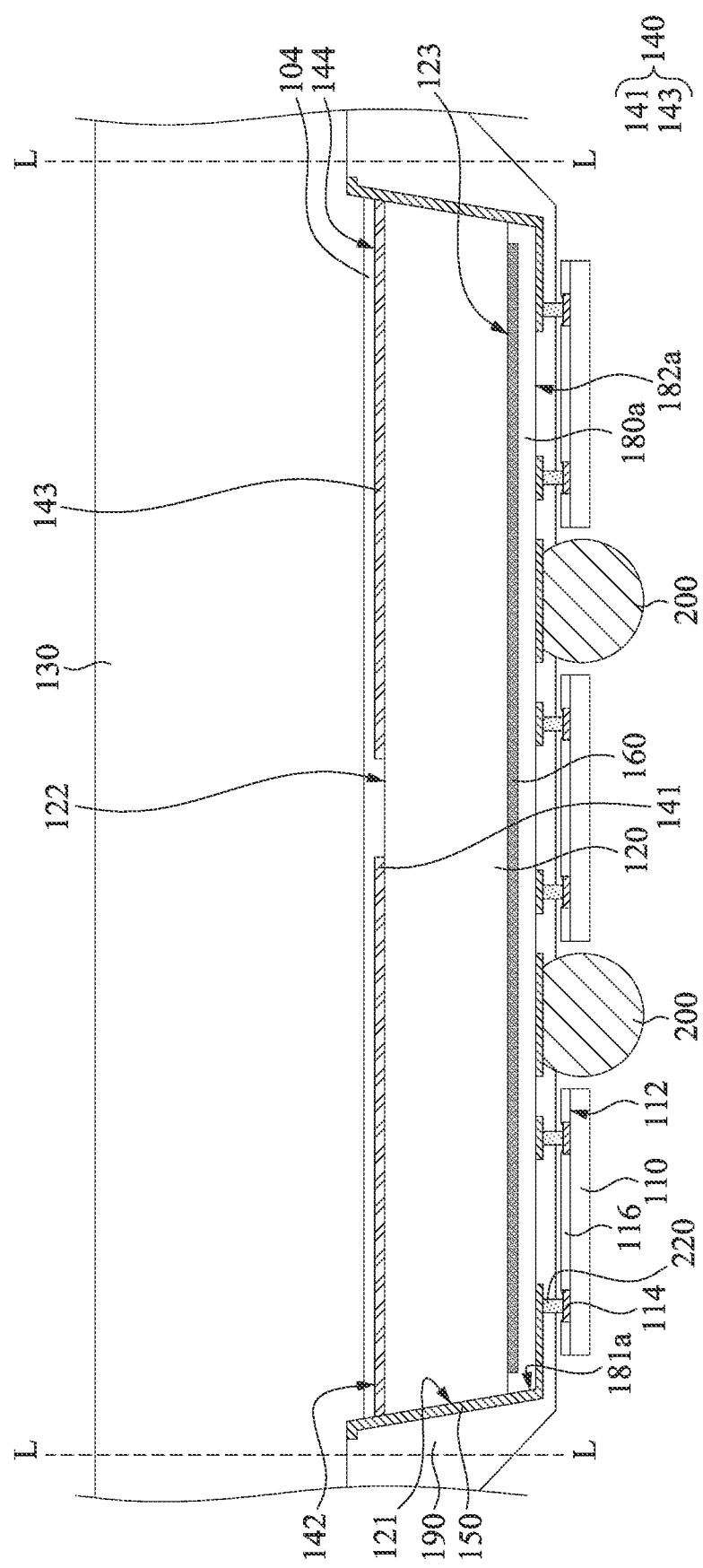

Referring to FIG. 28 and FIG. 29, the first light-transmissive sheet 120 in FIG. 24 is bonded to the semiconductor substrate 110 in FIG. 27. The conductive pillar 220 is aligned with the opening O1 of the passivation layer 190 (see FIG. 24). As such, both ends of the conductive pillar 220 may be in electrical contact with the redistribution layer 150 and the conductive pad 114, respectively, such that the electrical connection between the semiconductor substrate 110 and the antenna layer 140 can be achieved. Thereafter, the conductive structure 200 may be disposed on the opening O2 (see FIG. 24) of the passivation layer 190, such that the conductive structure 200 is in electrical contact with the redistribution layer 150. In greater details, the conductive structure 200 may be configured to electrically connect to other electronic devices (e.g., circuit boards). Then, the cutting process may be performed along the line L to obtain the chip package 100b in FIG. 20.

Figure 30:
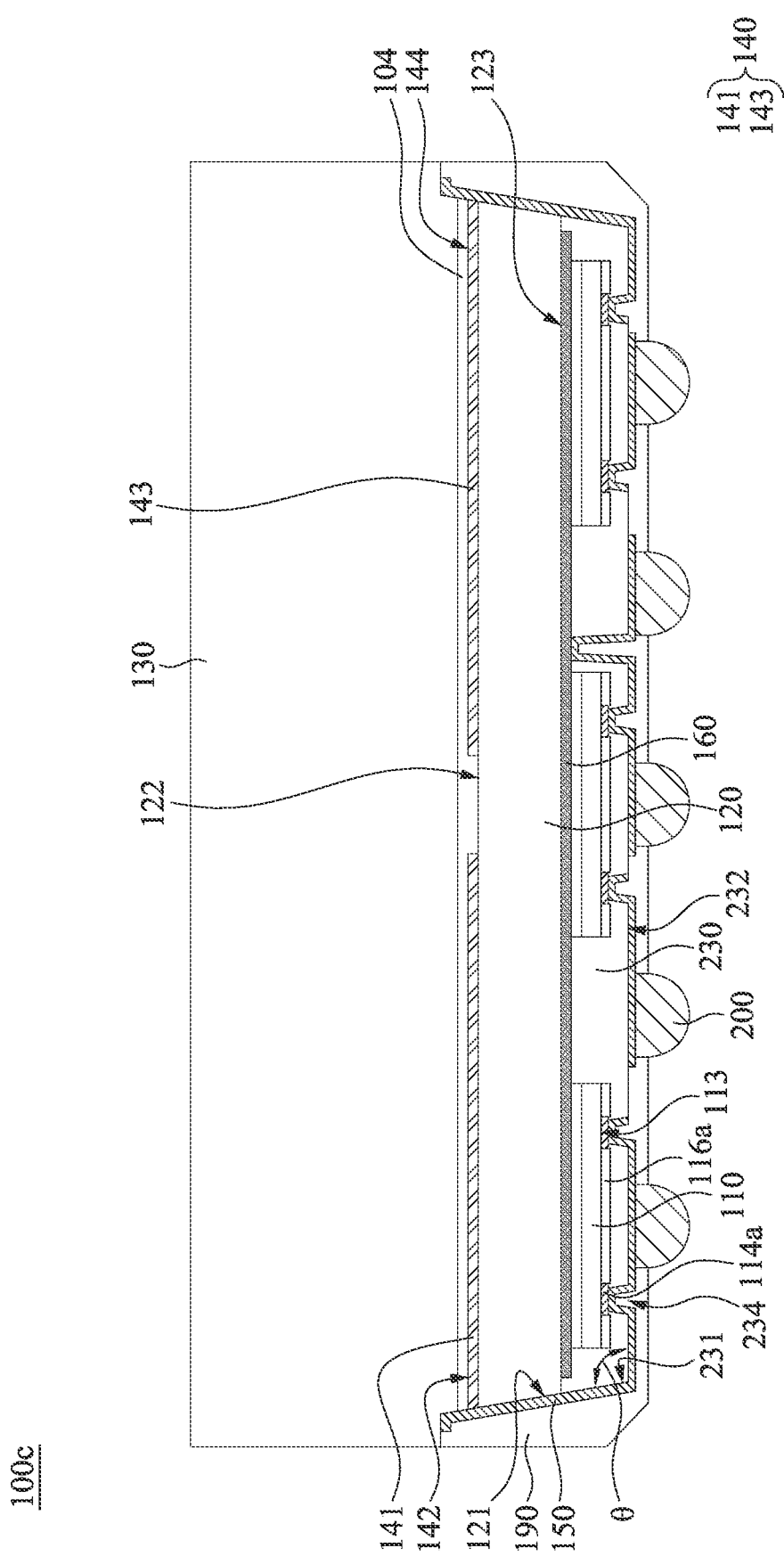
FIG. 30 is a cross-sectional view of the chip package according to another embodiment of the present invention.

FIG. 30 is a cross-sectional view of the chip package 100c according to another embodiment of the present invention. The chip package 100c includes the semiconductor substrate 110, the first light-transmissive sheet 120, the second light-transmissive sheet 130, the antenna layer 140, the redistribution layer 150, and a molding compound 230. Compared to the embodiment in FIG. 20, the chip package 100c does not have the planarization layer 180a (see FIG. 20), but the chip package 100c have the molding compound 230 surrounding the semiconductor substrate 110. The semiconductor substrate 110 and the molding compound 230 are disposed in the passivation layer 190. The molding compound 230 has a bottom surface 232 and an inclined sidewall 231 adjacent to the bottom surface 232, and a slope of the inclined sidewall 231 of the molding compound 230 is substantially equal to the slope of the inclined sidewall 121 of the first light-transmissive sheet 120. Moreover, the bottom surface 113 of the semiconductor substrate 110 has a conductive pad 114a and an insulating layer 116a. The molding compound 230 has an opening 234, and the conductive pad 114a is disposed in the opening 234. The redistribution layer 150 extends to the conductive pad 114a in the opening 234. In other words, the redistribution layer 150 is in electrical contact with the conductive pad 114a, and thus the electrical connection between the semiconductor substrate 110 and the antenna layer 140 can be achieved.

FIG. 31 to FIG. 39 are cross-sectional views at various stages of a manufacturing method of the chip package 100c in FIG. 30. For clarify, the steps of forming the antenna layer 140 over the first light-transmissive sheet 120, bonding the second light-transmissive sheet 130 on the first light-transmissive sheet 120, thinning the first light-transmissive sheet 120, forming the shielding layer 160 over the bottom surface 123 of the first light-transmissive sheet 120, and/or other steps are similar to the steps in FIG. 2 to FIG. 5, so the description is not repeated hereinafter.

Figure 31:
FIG. 31 to FIG. 39 are cross-sectional views at various stages of a manufacturing method of the chip package in FIG. 30.
Figure 32:
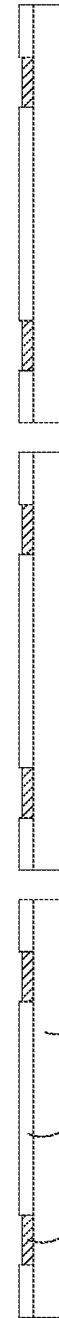

Referring to FIG. 31 and FIG. 32, the semiconductor substrate 110 has the conductive pad 114a and the insulating layer 116. The semiconductor substrate 110 may be thinned, for example, the bottom surface of the semiconductor substrate 110 is polished. Thereafter, the semiconductor substrate 110 may be cut to perform subsequent steps.

Figure 33:
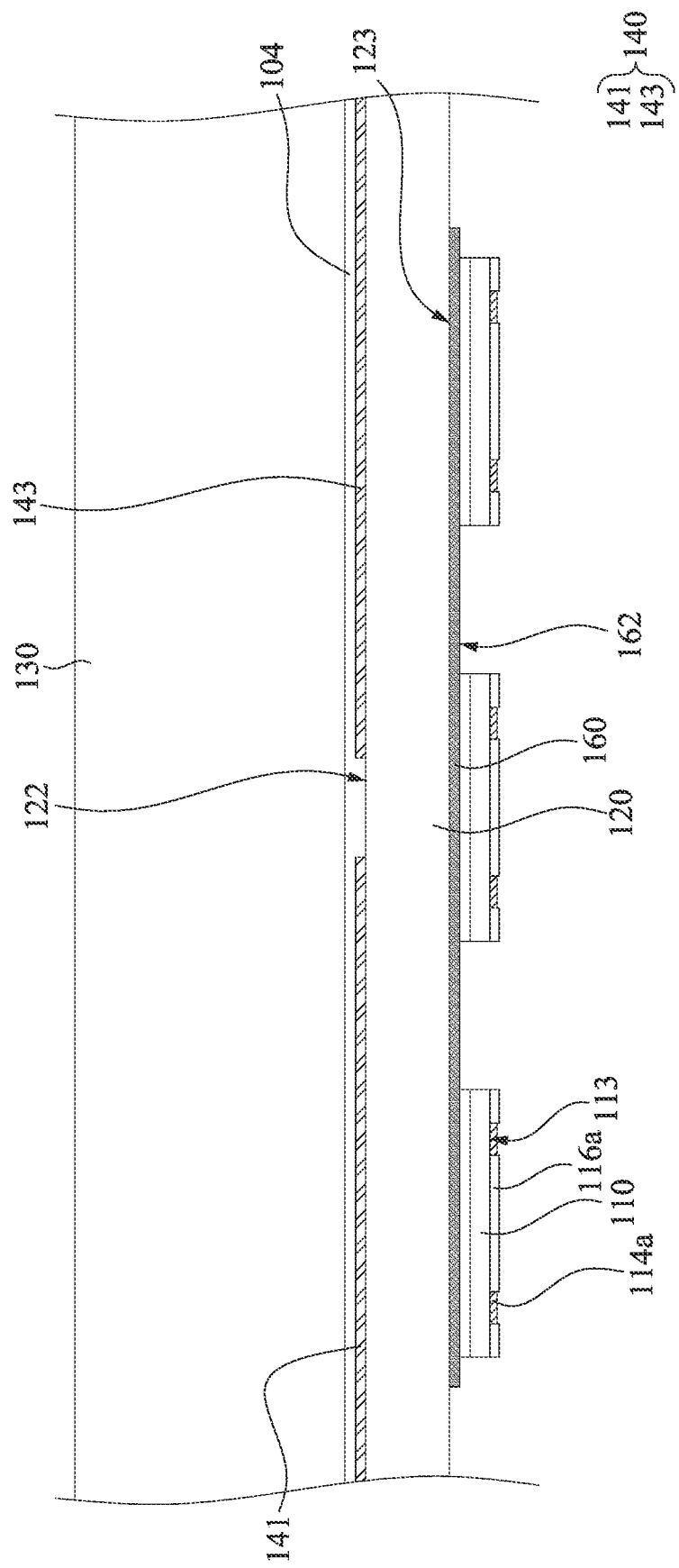

Referring to FIG. 33, the first light-transmissive sheet 120 before forming the planarization layer 180a in FIG. 21 is bonded to the semiconductor substrate 110 in FIG. 32. In greater details, the semiconductor substrate 110 is reversed, and the semiconductor substrate 110 is disposed on the bottom surface 162 of the shielding layer 160. In other words, the conductive pad 114a and the insulating layer 116 are disposed on the bottom surface 113 of the semiconductor substrate 110.

Figure 34:
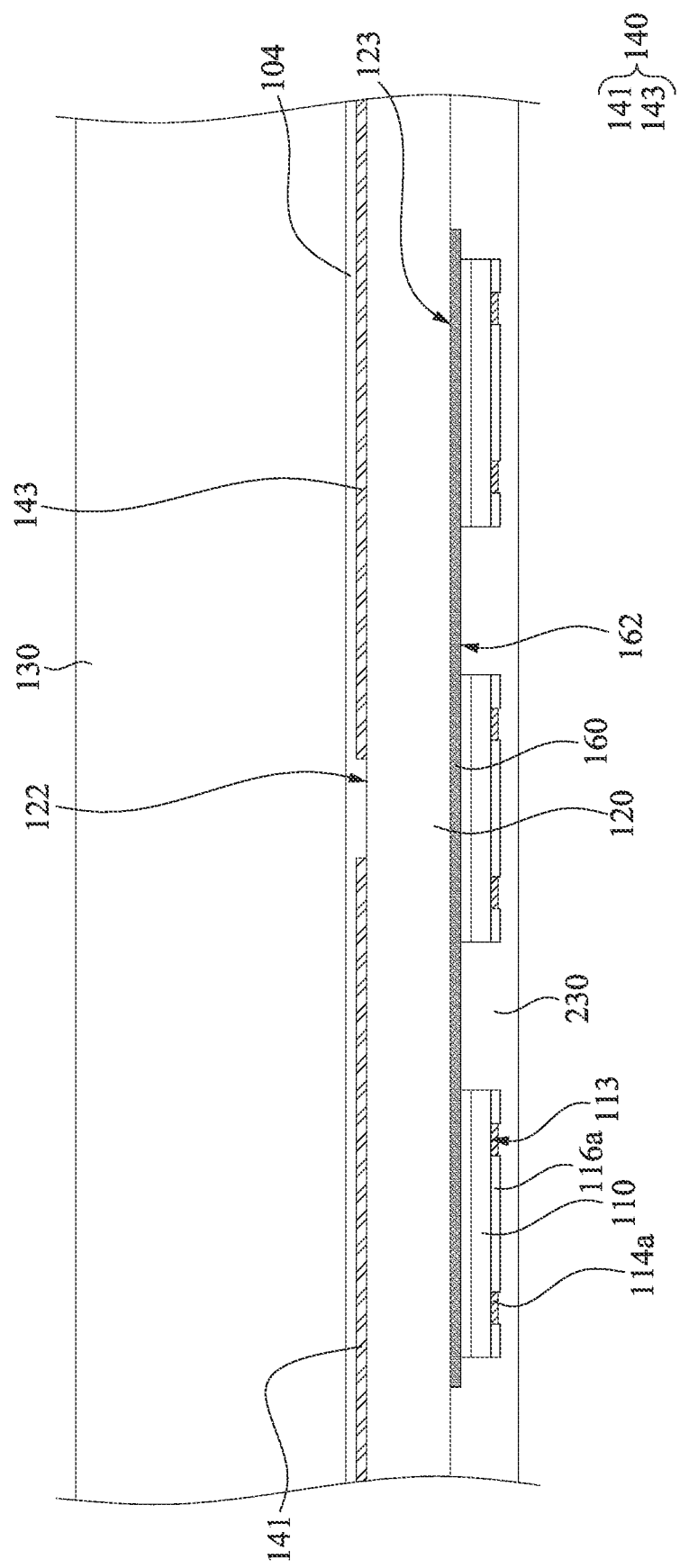

Referring to FIG. 34, the molding compound 230 is formed on the bottom surface 123 of the first light-transmissive sheet 120 and the bottom surface 162 of the shielding layer 160, and the molding compound 230 surrounds the semiconductor substrate 110. In other words, the molding compound 230 covers the semiconductor substrate 110, the first light-transmissive sheet 120, and the shielding layer 160.

Figure 35:
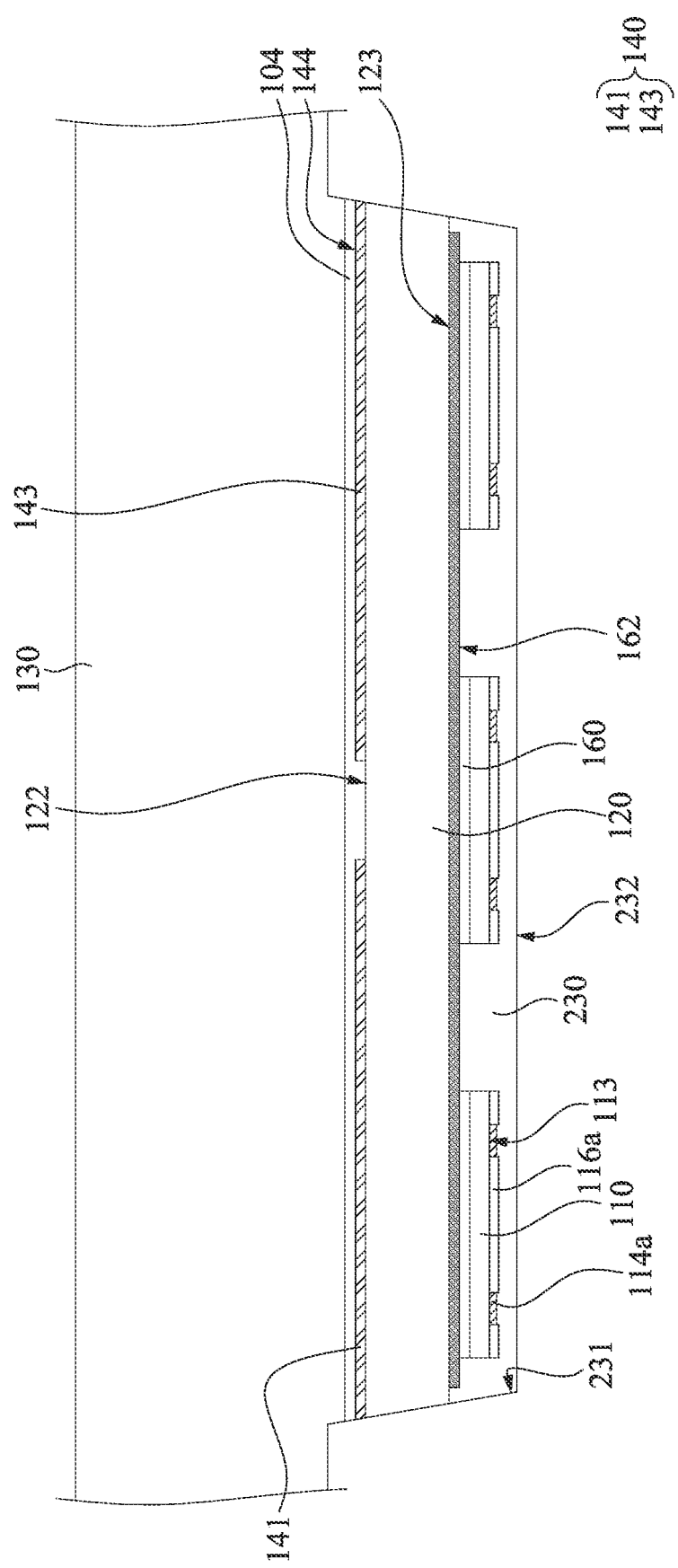

Referring to FIG. 35, a cutting process may be performed such that the first light-transmissive sheet 120 has the inclined sidewall 121 and the end 142 of the antenna layer 140 is exposed. In greater details, the end 142 of the first portion 141 of the antenna layer 140 and the end 144 of the second portion 143 of the antenna layer 140 are exposed. The cutting process may be performed with a cutting tool (cutting knife). During the cutting process, the molding compound 230 may simultaneously form the inclined sidewall 231. Since the cutting process may be performed with a single cutting tool, the slope of the inclined sidewall 231 of the molding compound 230 may be substantially equal to the slope of the inclined sidewall 121 of the first light-transmissive sheet 120. This design may benefit the stability of the subsequent redistribution layer 150 (see FIG. 37).

Figure 36:
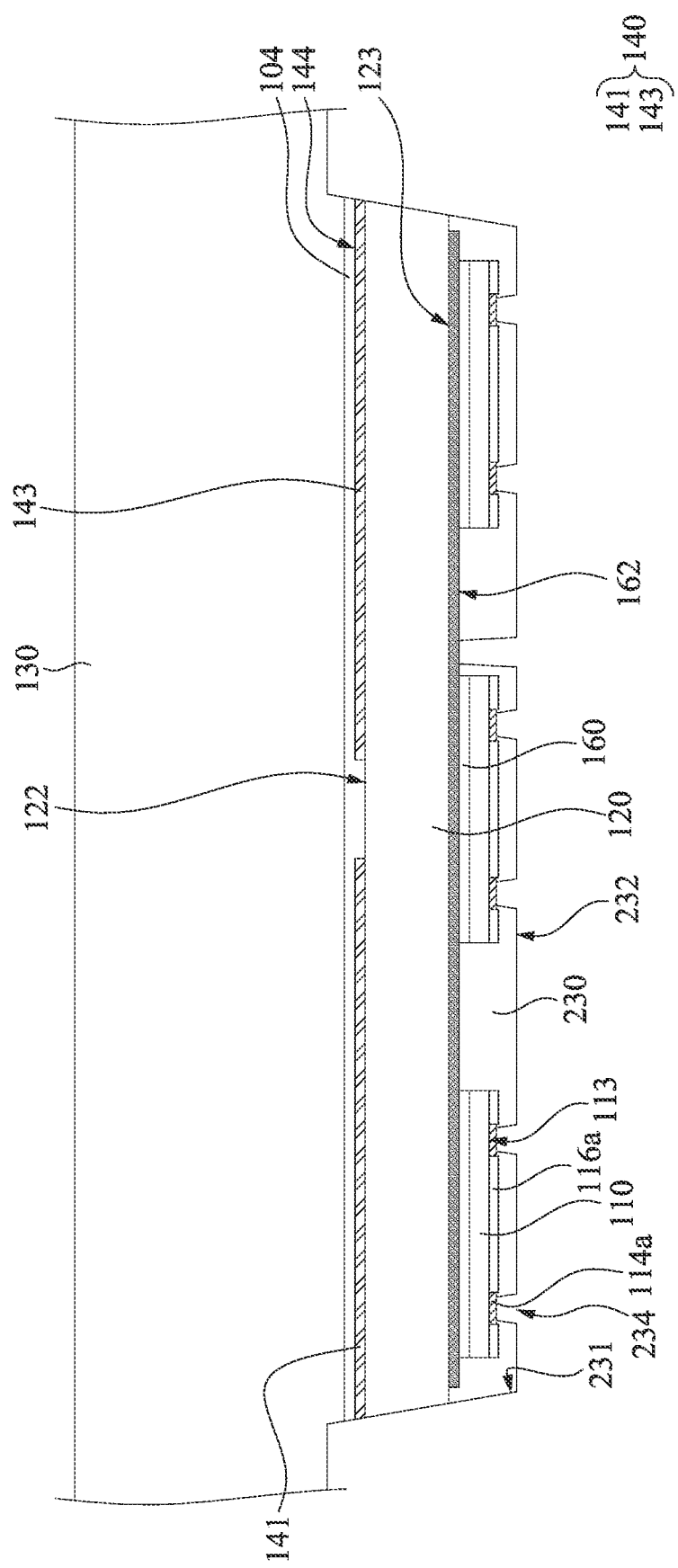
Figure 37:
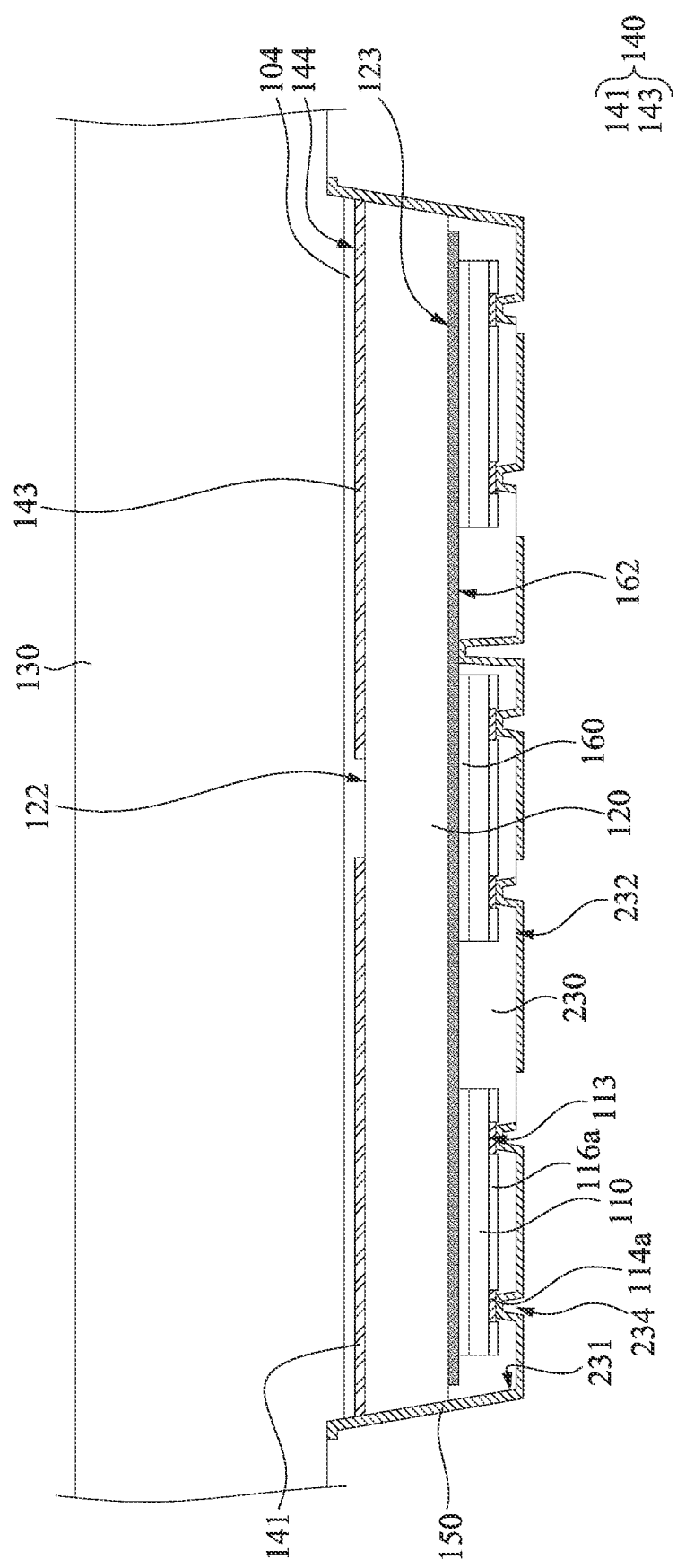

Referring to FIG. 36 and FIG. 37, after the structure in FIG. 35 is formed, the opening 234 is formed in the molding compound 230, such that the conductive pad 114a of the semiconductor substrate 110 is exposed. The method of forming the opening 234 in the molding compound 230 may include laser drilling. Thereafter, the redistribution layer 150 is formed on the inclined sidewall 121 of the first light-transmissive sheet 120, the inclined sidewall 231 of the molding compound 230, and the bottom surface 232 of the molding compound 230, such that the redistribution layer 150 is in contact with the end 142 of the first portion 141 of the antenna layer 140 and the end 144 of the second portion 143 of the antenna layer 140. Moreover, the redistribution layer 150 extends to the conductive pad 114a in the opening 234.

Figure 38:
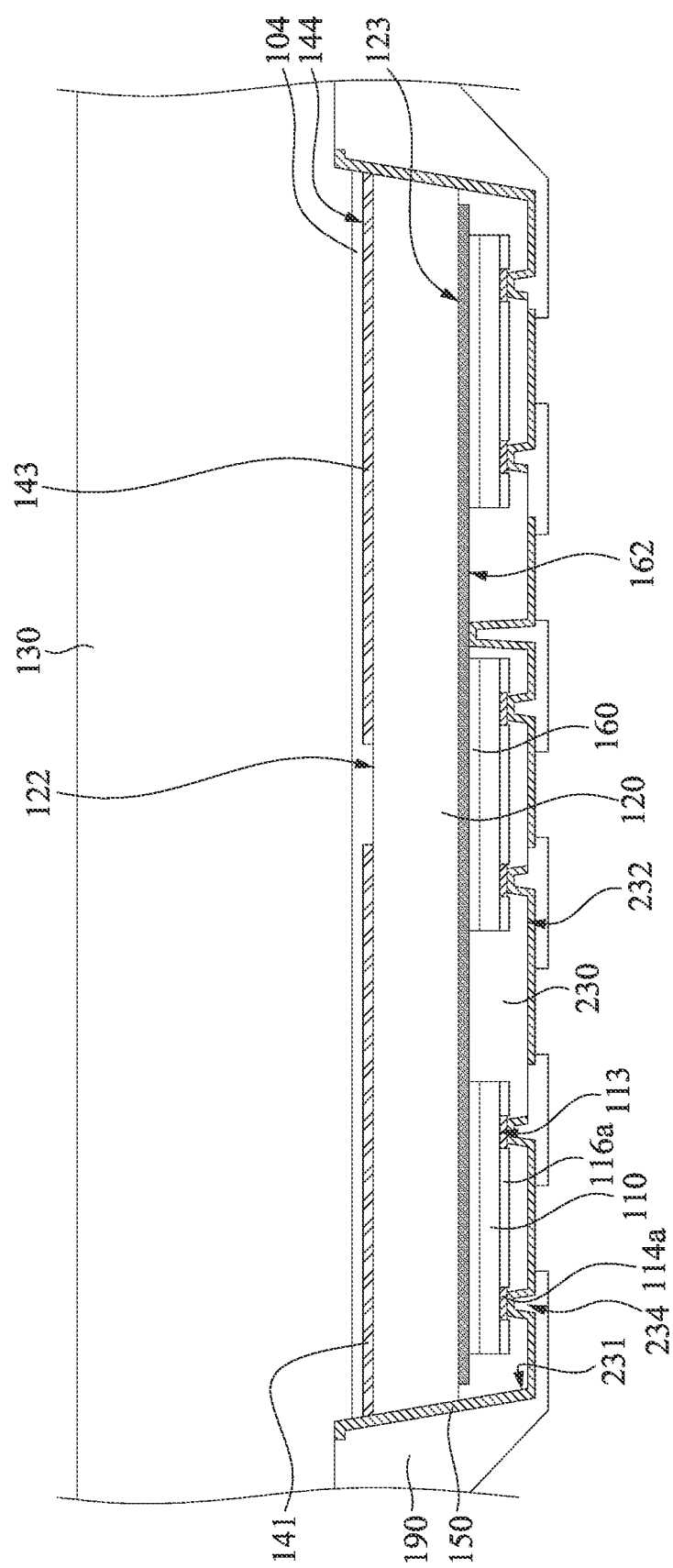

Referring to FIG. 38, in the subsequent processes, the passivation layer 190 may be formed to cover the redistribution layer 150 and the molding compound 230. Thereafter, the passivation layer 190 may be patterned such that the passivation layer 190 on the bottom surface 232 of the molding compound 230 may form an opening that exposes the redistribution layer 150.

Figure 39:
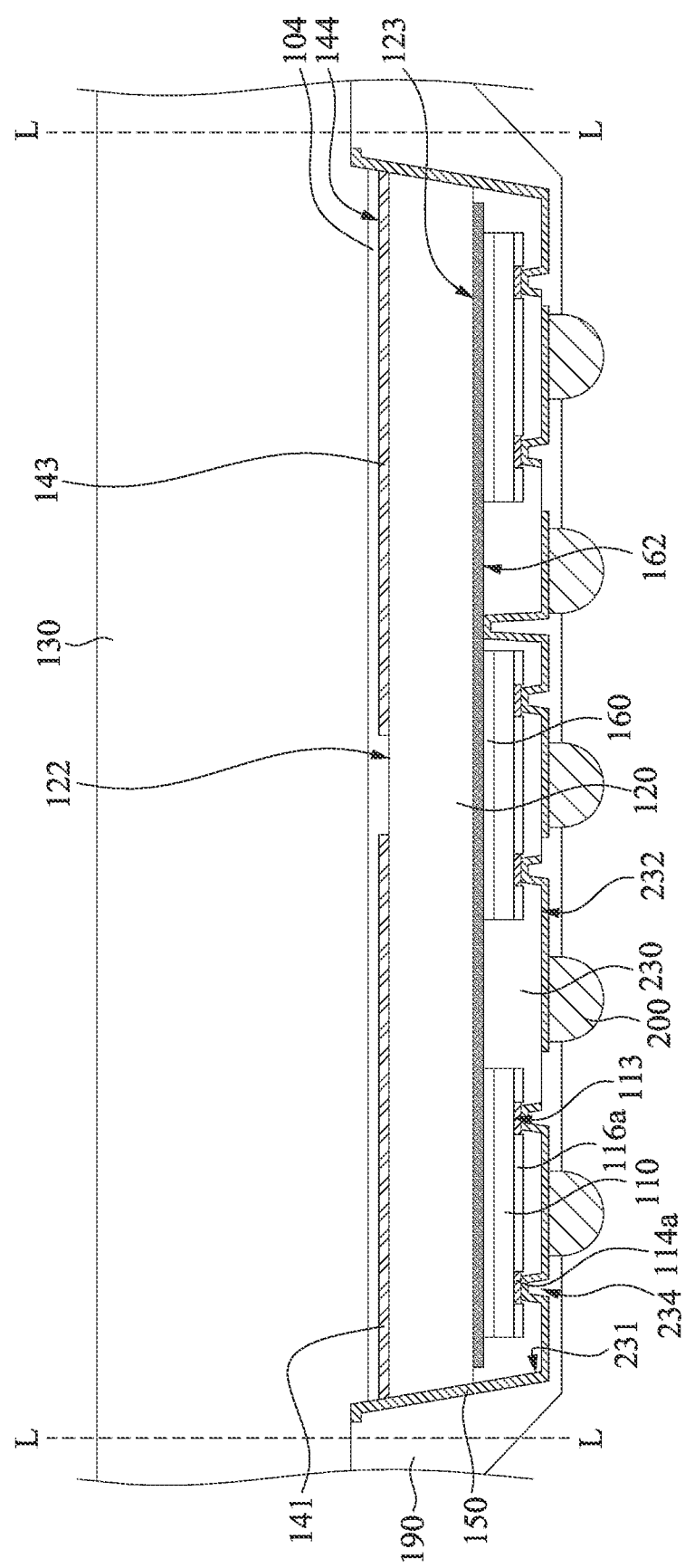

Referring to FIG. 39, the conductive structure 200 may be disposed on the opening of the passivation layer 190, such that the conductive structure 200 is in electrical contact with the redistribution layer 150. In greater details, the conductive structure 200 may be configured to electrically connect to other electronic devices (e.g., circuit boards). Then, the cutting process may be performed along the line L to obtain the chip package 100c in FIG. 30.

Figure 40:
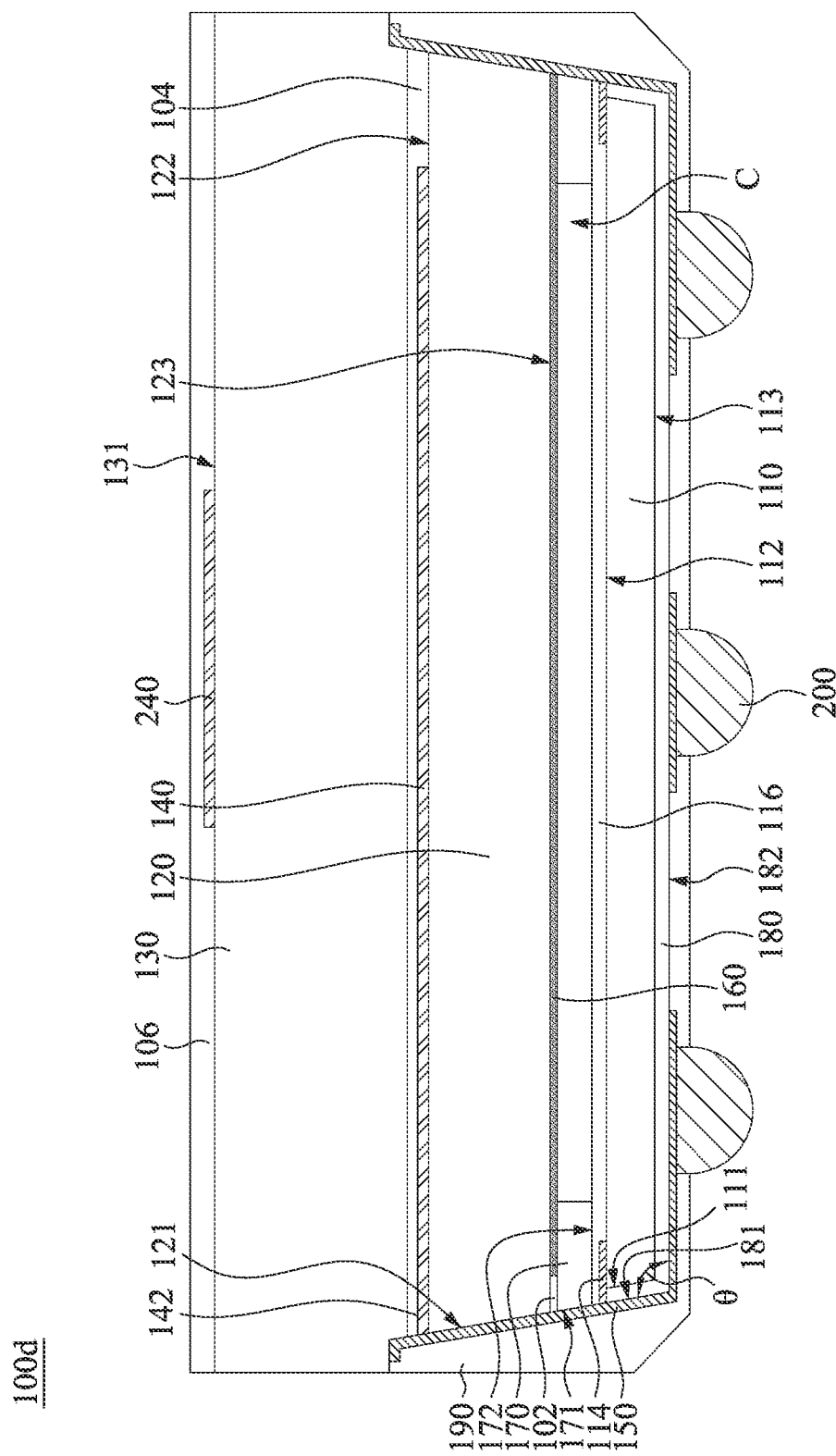
FIG. 40 is a cross-sectional view of the chip package according to another embodiment of the present invention.

FIG. 40 is a cross-sectional view of the chip package 100d according to another embodiment of the present invention. The chip package 100d includes the semiconductor substrate 110, the first light-transmissive sheet 120, the second light-transmissive sheet 130, the antenna layer 140, the redistribution layer 150, an antenna layer 240, and a protective layer 106. Compared to the embodiment in FIG. 1, the chip package 100d further includes the antenna layer 240 and the protective layer 106. The antenna layer 240 may be disposed on a top surface 131 of the second light-transmissive sheet 130. In some embodiments, a length of the antenna layer 240 is smaller than a length of the antenna layer 140. The antenna layer 240 may partially covers the antenna layer 140. Specifically, a vertical projection of the antenna layer 240 on the first light-transmissive sheet 120 overlaps with a vertical projection of the antenna layer 140 on the first light-transmissive sheet 120. In some embodiments, the materials and the forming method of the antenna layer 240 are substantially equal to the materials and the forming method of the antenna layer 140. For example, the antenna layer 240 may include copper or silver, and may be formed by performing physical vapor deposition (e.g., sputtering).

In some embodiments, the protective layer 106 covers the second light-transmissive sheet 130 and the antenna layer 240. In greater details, the protective layer 106 is in contact with the top surface 131 of the second light-transmissive sheet 130 and the protective layer 106 surrounds the antenna layer 240. For example, the protective layer 106 is glue.

In some embodiments, the manufacturing method of the chip package 100d may form the antenna layer 240 on the top surface 131 of the second light-transmissive sheet 130 before bonding the second light-transmissive sheet 130 on the first light-transmissive sheet 120. The method of forming the antenna layer 240 may include forming a conductive layer (e.g., by sputtering) on the entire top surface 131 of the second light-transmissive sheet 130, and then patterning the conductive layer to form the antenna layer 240. The process of patterning the conductive layer may include exposure, development, etching, and other suitable processes. After the antenna layer 240 is formed on the second light-transmissive sheet 130, the protective layer 106 may be formed on the antenna layer 240 and the second light-transmissive sheet 130 so as to cover the antenna layer 240 and the second light-transmissive sheet 130.

Figure 41:
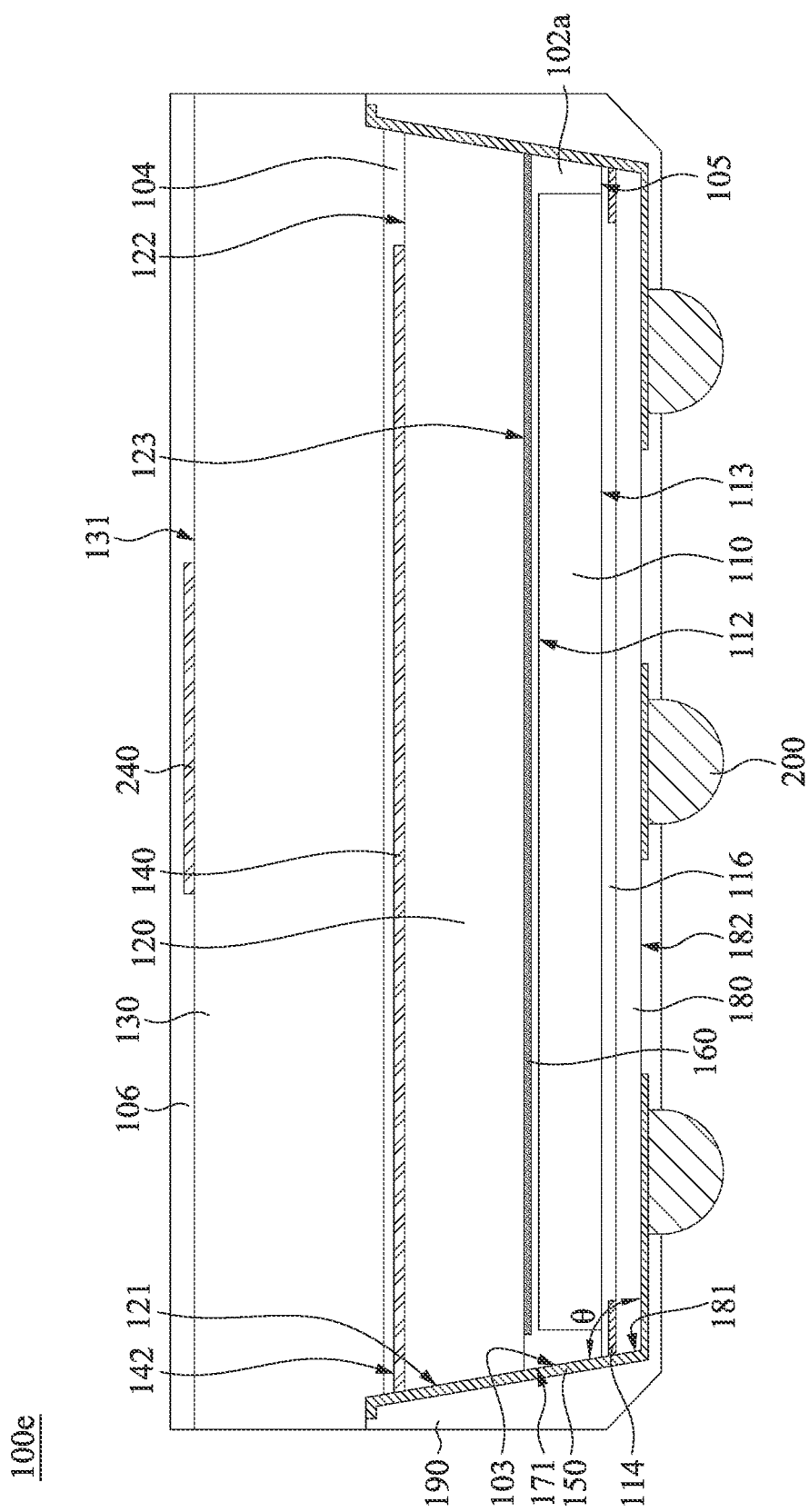
FIG. 41 is a cross-sectional view of the chip package according to another embodiment of the present invention.

FIG. 41 is a cross-sectional view of the chip package 100e according to another embodiment of the present invention. The chip package 100e includes the semiconductor substrate 110, the first light-transmissive sheet 120, the second light-transmissive sheet 130, the antenna layer 140, the redistribution layer 150, the bonding layer 102a, an antenna layer 240, and a protective layer 106. Compared to the embodiment in FIG. 12, the chip package 100e further includes the antenna layer 240 and the protective layer 106. The antenna layer 240 may be disposed on a top surface 131 of the second light-transmissive sheet 130. In some embodiments, a length of the antenna layer 240 is smaller than a length of the antenna layer 140. The antenna layer 240 may partially covers the antenna layer 140. Specifically, a vertical projection of the antenna layer 240 on the first light-transmissive sheet 120 overlaps with a vertical projection of the antenna layer 140 on the first light-transmissive sheet 120. In some embodiments, the materials and the forming method of the antenna layer 240 are substantially equal to the materials and the forming method of the antenna layer 140. For example, the antenna layer 240 may include copper or silver, and may be formed by performing physical vapor deposition (e.g., sputtering).

In some embodiments, the protective layer 106 covers the second light-transmissive sheet 130 and the antenna layer 240. In greater details, the protective layer 106 is in contact with the top surface 131 of the second light-transmissive sheet 130 and the protective layer 106 surrounds the antenna layer 240. For example, the protective layer 106 is glue.

Figure 42:
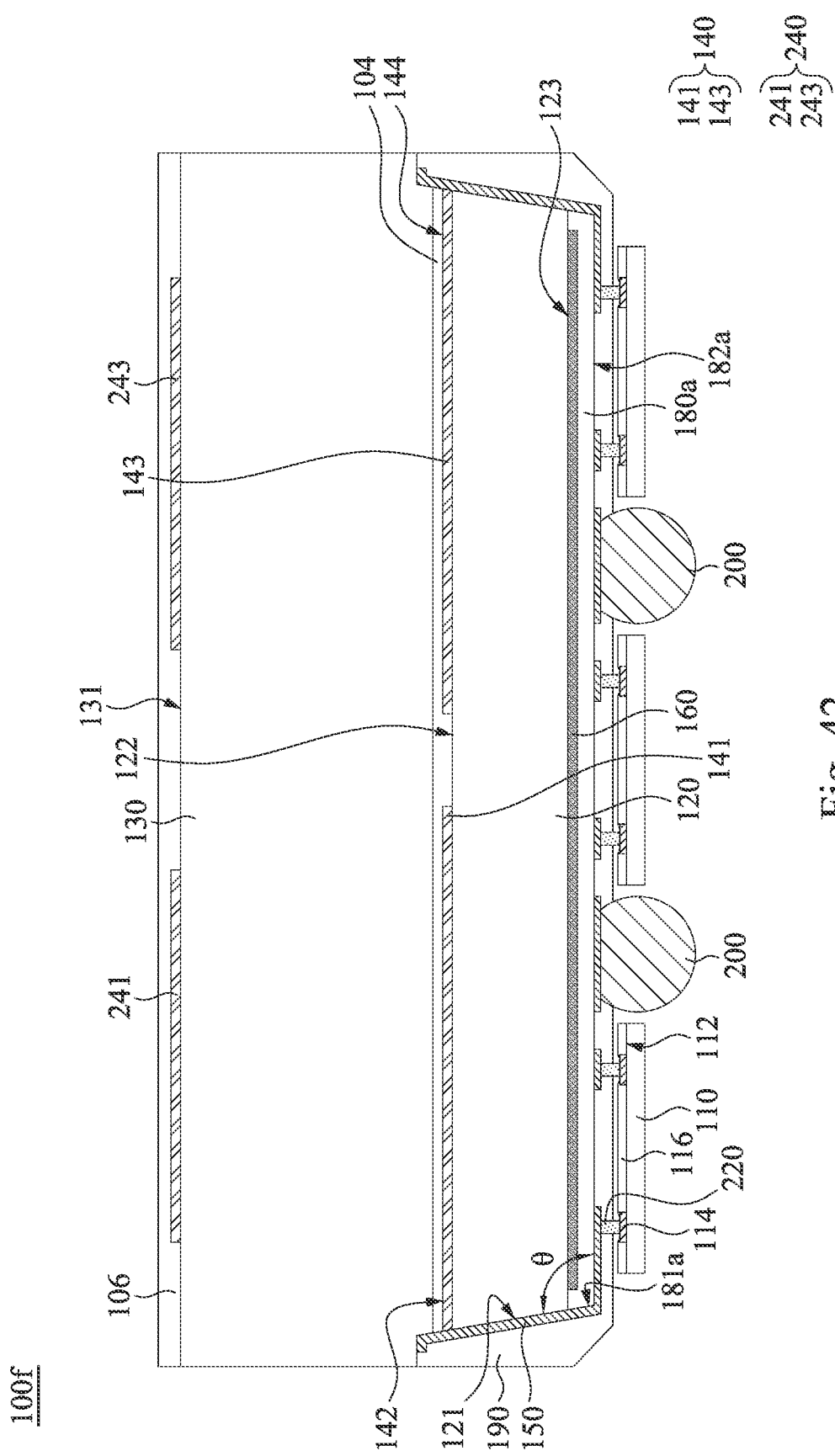
FIG. 42 is a cross-sectional view of the chip package according to another embodiment of the present invention.

FIG. 42 is a cross-sectional view of the chip package 100f according to another embodiment of the present invention. The chip package 100f includes the semiconductor substrate 110, the first light-transmissive sheet 120, the second light-transmissive sheet 130, the antenna layer 140, the redistribution layer 150, the planarization layer 180a, the conductive pillar 220, an antenna layer 240, and a protective layer 106. Compared to the embodiment in FIG. 20, the chip package 100f further includes the antenna layer 240 and the protective layer 106, in which the antenna layer 240 has a first portion 241 and a second portion 243. The antenna layer 240 may be disposed on a top surface 131 of the second light-transmissive sheet 130. In the present embodiment, the antenna layer 240 is an antenna array. In some embodiments, a length of the antenna layer 140 is greater than a length of the antenna layer 240. Specifically, a length of the first portion 141 of the antenna layer 140 is greater than a length of the first portion 241 of the antenna layer 240, and a length of the second portion 143 of the antenna layer 140 is greater than a length of the second portion 243 of the antenna layer 240. In some embodiments, the antenna layer 240 may partially covers the antenna layer 140. Specifically, a vertical projection of the antenna layer 240 on the first light-transmissive sheet 120 overlaps with a vertical projection of the antenna layer 140 on the first light-transmissive sheet 120. That is, a vertical projection of the first portion 241 of the antenna layer 240 on the first light-transmissive sheet 120 overlaps with a vertical projection of the first portion 141 of the antenna layer 140 on the first light-transmissive sheet 120, and a vertical projection of the second portion 243 of the antenna layer 240 on the first light-transmissive sheet 120 overlaps with a vertical projection of the second portion 143 of the antenna layer 140 on the first light-transmissive sheet 120. In some embodiments, the materials and the forming method of the antenna layer 240 are substantially equal to the materials and the forming method of the antenna layer 140. For example, the antenna layer 240 may include copper or silver, and may be formed by performing physical vapor deposition (e.g., sputtering).

In some embodiments, the protective layer 106 covers the second light-transmissive sheet 130 and the antenna layer 240. In greater details, the protective layer 106 is in contact with the top surface 131 of the second light-transmissive sheet 130 and the protective layer 106 surrounds the first portion 241 of the antenna layer 240 and the second portion 243 of the antenna layer 240. For example, the protective layer 106 is glue.

Figure 43:
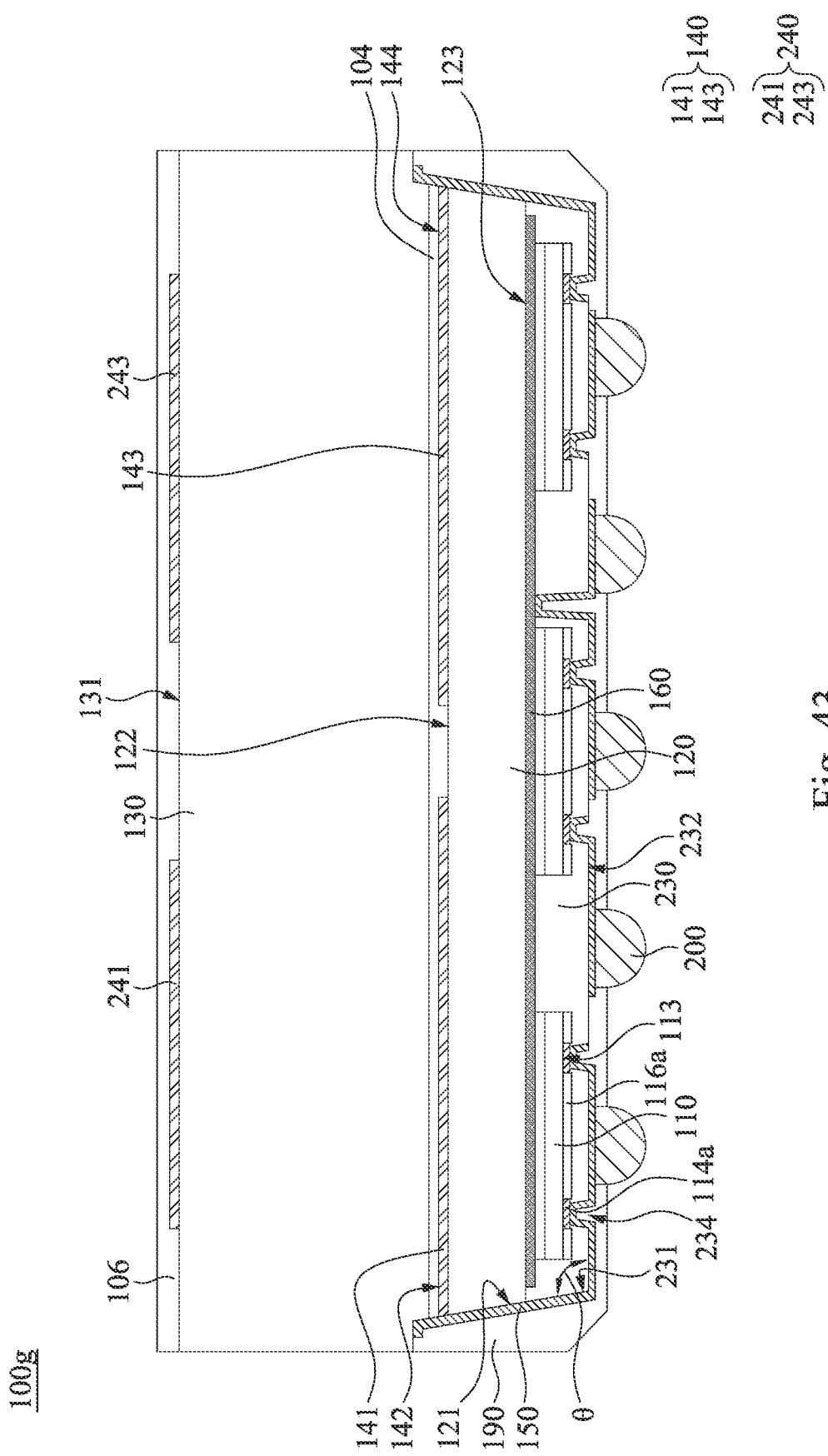
FIG. 43 is a cross-sectional view of the chip package according to another embodiment of the present invention.

FIG. 43 is a cross-sectional view of the chip package 100g according to another embodiment of the present invention. The chip package 100g includes the semiconductor substrate 110, the first light-transmissive sheet 120, the second light-transmissive sheet 130, the antenna layer 140, the redistribution layer 150, the molding compound 230, an antenna layer 240, and a protective layer 106. Compared to the embodiment in FIG. 30, the chip package 100g further includes the antenna layer 240 and the protective layer 106, in which the antenna layer 240 has a first portion 241 and a second portion 243. The antenna layer 240 may be disposed on a top surface 131 of the second light-transmissive sheet 130. In the present embodiment, the antenna layer 240 is an antenna array. In some embodiments, a length of the antenna layer 140 is greater than a length of the antenna layer 240. Specifically, a length of the first portion 141 of the antenna layer 140 is greater than a length of the first portion 241 of the antenna layer 240, and a length of the second portion 143 of the antenna layer 140 is greater than a length of the second portion 243 of the antenna layer 240. In some embodiments, the antenna layer 240 may partially covers the antenna layer 140. Specifically, a vertical projection of the antenna layer 240 on the first light-transmissive sheet 120 overlaps with a vertical projection of the antenna layer 140 on the first light-transmissive sheet 120. That is, a vertical projection of the first portion 241 of the antenna layer 240 on the first light-transmissive sheet 120 overlaps with a vertical projection of the first portion 141 of the antenna layer 140 on the first light-transmissive sheet 120, and a vertical projection of the second portion 243 of the antenna layer 240 on the first light-transmissive sheet 120 overlaps with a vertical projection of the second portion 143 of the antenna layer 140 on the first light-transmissive sheet 120. In some embodiments, the materials and the forming method of the antenna layer 240 are substantially equal to the materials and the forming method of the antenna layer 140. For example, the antenna layer 240 may include copper or silver, and may be formed by performing physical vapor deposition (e.g., sputtering).

In some embodiments, the protective layer 106 covers the second light-transmissive sheet 130 and the antenna layer 240. In greater details, the protective layer 106 is in contact with the top surface 131 of the second light-transmissive sheet 130 and the protective layer 106 surrounds the first portion 241 of the antenna layer 240 and the second portion 243 of the antenna layer 240. For example, the protective layer 106 is glue.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing form the scope or spirit of the invention. In view of the foregoing, it is intended that the present invention covers modifications and variations of this invention provided they fall within the scope of the following claims.

What is claimed is:

1. A chip package, comprising:
   a semiconductor substrate;
   a first light-transmissive sheet over a top surface of the semiconductor substrate, wherein the first light-transmissive sheet has a top surface facing away from the semiconductor substrate and an inclined sidewall adjacent to the top surface of the first light-transmissive sheet;
   a shielding layer between the semiconductor substrate and the first light-transmissive sheet;
   a second light-transmissive sheet over the top surface of the first light-transmissive sheet, wherein the first light-transmissive sheet is located between the second light-transmissive sheet and the semiconductor substrate;
   a first antenna layer between the first light-transmissive sheet and the second light-transmissive sheet; and
   a redistribution layer on the inclined sidewall of the first light-transmissive sheet, and in contact with an end of the first antenna layer.

2. The chip package of claim 1, wherein the first light-transmissive sheet has a bottom surface opposite to the top surface of the first light-transmissive sheet, and the shielding layer is in contact with the bottom surface.

3. The chip package of claim 1, further comprising:
   a supporting element between the semiconductor substrate and the first light-transmissive sheet, wherein the supporting element has a bottom surface and an inclined sidewall adjacent to the bottom surface, and wherein a slope of the inclined sidewall of the supporting element is substantially equal to a slope of the inclined sidewall of the first light-transmissive sheet.

4. The chip package of claim 3, wherein the redistribution layer is disposed on the inclined sidewall of the supporting element.

5. The chip package of claim 3, wherein the top surface of the semiconductor substrate has a conductive pad, and a sidewall of the conductive pad is in contact with the redistribution layer.

6. The chip package of claim 1, wherein the first antenna layer is in contact with the top surface of the first light-transmissive sheet.

7. The chip package of claim 1, wherein the semiconductor substrate has a bottom surface facing away from the first light-transmissive sheet, and the chip package further comprises:
   a planarization layer covering the bottom surface of the semiconductor substrate, wherein the planarization layer has a bottom surface and an inclined sidewall adjacent to the bottom surface, and wherein a slope of the inclined sidewall of the planarization layer is substantially equal to a slope of the inclined sidewall of the first light-transmissive sheet.

8. The chip package of claim 1, further comprising:
   a second antenna layer on a top surface of the second light-transmissive sheet.

9. The chip package of claim 8, further comprising:
   a protective layer covering the second light-transmissive sheet and the second antenna layer.

* * * * *